United States Patent [19]
Ono et al.

[11] Patent Number: 5,193,268
[45] Date of Patent: Mar. 16, 1993

[54] PARTS FEEDING SYSTEM UTILIZING AN UNMANNED CONVEYING MACHINE

[75] Inventors: Michihiko Ono, Kohdera; Syozo Kawashima, Ono, both of Japan

[73] Assignee: Sanyo Electric Co., Ltd., Osaka, Japan

[21] Appl. No.: 911,795

[22] Filed: Jul. 10, 1992

Related U.S. Application Data

[63] Continuation of Ser. No. 609,690, Nov. 6, 1990, abandoned.

[30] Foreign Application Priority Data

Nov. 7, 1989 [JP] Japan .................. 1-289214
Nov. 10, 1989 [JP] Japan .................. 1-292813

[51] Int. Cl.⁵ .............................. B23P 19/00
[52] U.S. Cl. ............................ 29/739; 29/729; 29/760; 29/771; 29/824
[58] Field of Search ............ 29/720, 721, 729, 739, 29/740, 741, 760, 771, 791, 822, 823, 824

[56] References Cited
U.S. PATENT DOCUMENTS
4,674,181 6/1987 Hamada et al. .................. 29/720

FOREIGN PATENT DOCUMENTS
312116 4/1989 European Pat. Off. .......... 24/729

Primary Examiner—P. W. Echols
Assistant Examiner—David P. Bryant
Attorney, Agent, or Firm—Nikaido, Marmelstein, Murray & Oram

[57] ABSTRACT

A parts feeding system includes an unmanned conveying machine, capable of conveying a parts carriage holding a plurality of parts cassettes thereon and movable along a guide track which is laid on a floor, one or more parts mounters and a logistics base provided with a parts stocker. The parts carriage is returned to the logistics base by the unmanned conveying machine for supply or exchange of parts. The work in the logistics base is performed by a worker or robots. The parts carriage loaded with required parts cassette is delivered to an assigned parts mounter by the unmanned conveying machine. Each of the parts mounters includes a track for a carriage carrier moving thereon, which includes a work station where the parts are picked up, and a carriage change station where the parts carriage is loaded to the track from the unmanned conveying machine or vice versa.

14 Claims, 23 Drawing Sheets

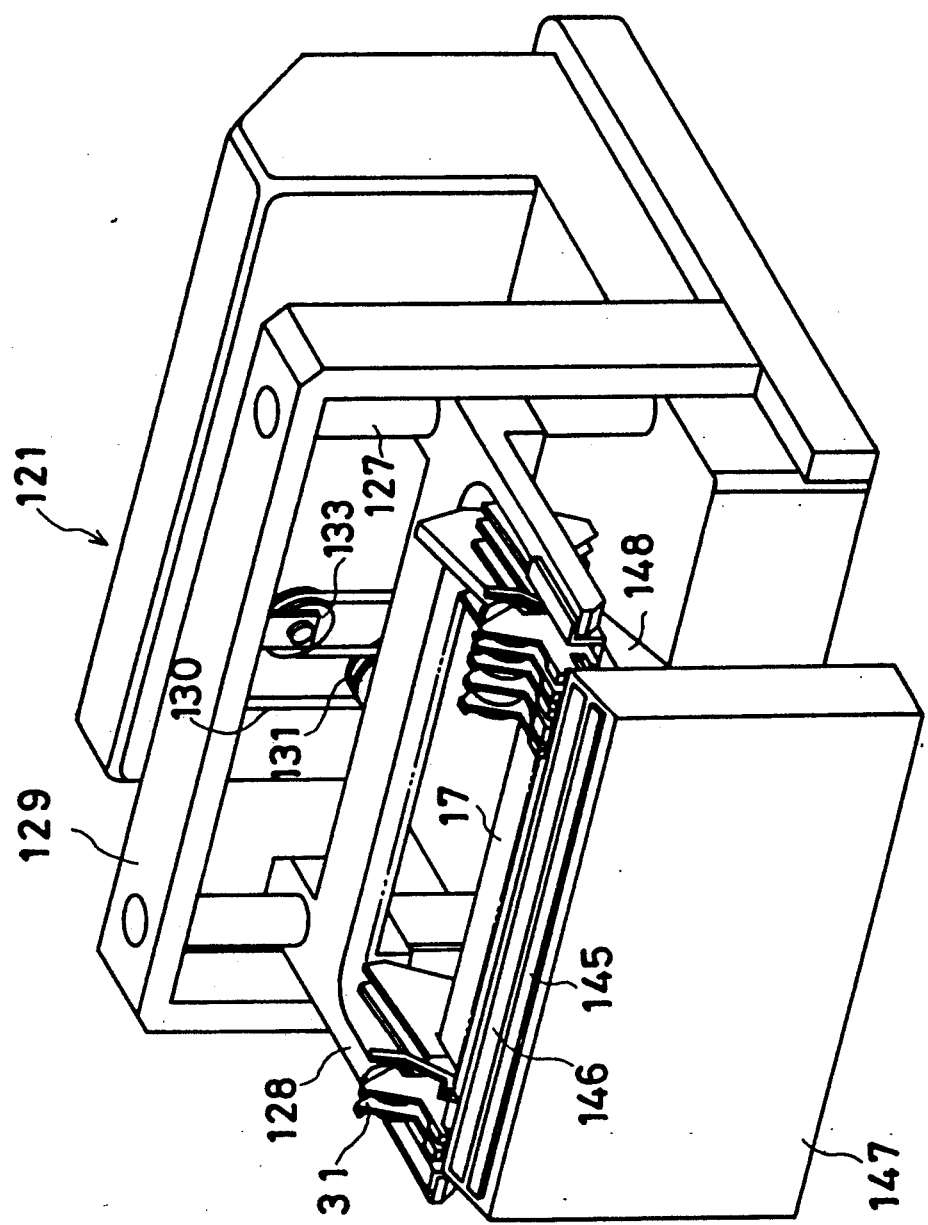
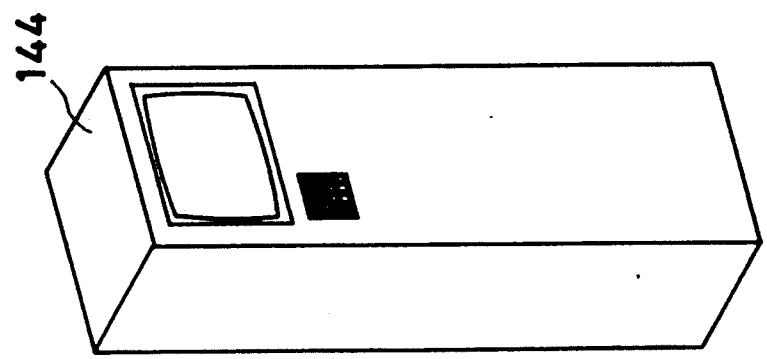
FIG. 14

PARTS FEEDING SYSTEM UTILIZING AN UNMANNED CONVEYING MACHINE

This application is a division of application Ser. No. 609,690 filed Nov. 6, 1990, now abandoned.

BACKGROUND OF THE INVENTION

1. Field of the invention

The present invention relates to a parts feeding system. More specifically, the present invention relates to a system for feeding parts to a parts mounter, which can be utilized for the process of assembling an electronic circuit board with electronic parts.

2. Description of the prior art

As a parts feeding system in an electronic parts mounter, an apparatus has been dominant in which a plurality of parts feeding cassettes are detachably arranged on a single table and an arbitrary parts feeding cassette is placed in a parts taking-out position by linearly moving the table. In addition, an apparatus having a plurality of tables has been recently put into practice. An example of such an apparatus can be seen in Japanese Patent Laid-Open Gazette No. 140499/1987. This apparatus has two tables, so that a worker can supply one table with parts while parts are fed by the other table, and the operating efficiency thereof is made higher than that of an apparatus having only one table.

In the above described system, a worker must go to the apparatus to replace a parts feeding cassette or to supply parts to the parts feeding cassette every time when the parts on the table run out. In addition, all parts feeding cassettes may, in some cases, be exchanged at the time of changing the kinds or types of a circuit board to be assembled, so that the worker must perform laborious work in a short time so as to increase the operation efficiency of the apparatus.

SUMMARY OF THE INVENTION

Therefore, a principal object of the present invention is to provide a novel parts feeding system.

Another object of the present invention is to provide a parts feeding system in which exchange or supply of parts can be performed effectively.

The other object of the present invention is to provide a parts feeding system in which it is possible to increase a labor-saving efficiency of a parts mounter.

A parts feeding system in accordance with the present invention comprises: a carriage detachably combined with a parts mounter, the carriage including parts to be mounted on a circuit board; an unmanned conveying machine for receiving the parts carriage from the parts mounter or delivering the parts carriage to the parts mounter; a logistics base for the unmanned conveying machine; a parts stocker arranged at the logistics base; and a designation portion arranged at the logistics base for designating supply or exchange of parts from the parts stocker to the parts carriage Furthermore, the system comprises a central control unit for supervising and controlling the parts mounter, the unmanned conveying machine, the designation portion and the parts stocker.

When there arises the necessity of supplying or replacing parts in a parts carriage, the unmanned conveying machine approaches a parts mounter to retrieve the parts carriage from the parts mounter and convey the same to the logistics base. At the same time, another unmanned conveying machine on which a parts carriage is loaded having parts supplied or exchanged based upon the designation content of the designation unit, departs from the logistics base to deliver this parts carriage to the above parts mounter.

In accordance with the present invention, the designation unit for designating supply or exchange of the parts and the stocker are provided in the logistics base for the unmanned conveying machine, and a parts carriage requiring supply or exchange of parts is conveyed from the parts mounter to the logistics base by the unmanned conveying machine, and the parts carriage full-equipped with parts is conveyed again to the parts mounter by the unmanned conveying machine and delivered thereto, whereby it becomes unnecessary to go to the parts mounter to perform the supply or exchange of the parts even if the parts carriage becomes empty.

Furthermore, since the parts mounter, the unmanned conveying machine, the designation unit and the parts stocker are supervised and controlled by the central control unit, it is possible to increase the work efficiently with harmony of the movement or operations of the respective elements.

In another aspect of the present invention, instead of the above described designation unit, a robot for supplying or replacing parts is provided in the above described logistics base.

In this aspect, the central control unit supervises and controls the parts mounter, the unmanned conveying machine and the robot.

When there arises the necessity of supplying or replacing parts in a parts carriage, an unmanned conveying machine approaches a parts mounter to retrieve the parts carriage from the parts mounter and convey the same to the logistics base. At the same time, another unmanned conveying machine on which a parts carriage having parts supplied or exchanged by the robot is disposed departs from the logistics base to deliver this parts carriage to the parts mounter.

In accordance with the above described aspect of the present invention, the robot for supplying or replacing parts and the parts stocker are provided in the logistics base. A parts carriage requiring supply or exchange of parts is conveyed from the parts mounter by the unmanned conveying machine and a parts carriage full-equipped with parts by the robot is conveyed again to the parts mounter by the unmanned conveying machine and delivered thereto, thereby making it possible to entirely automate the work of supplying or replacing parts in the parts carriage.

Furthermore, the parts mounter, the unmanned conveying machine, the robot and the stocker are supervised and controlled, thereby making it possible to perform the work efficiently and accurately.

These objects and other features, aspects and advantages of the present invention will become more apparent from the following detailed description of the embodiments of the present invention when taken in conjunction with accompanying drawings.

BRIEF DESCRIPTION OF THE DRAWINGS

FIG. 14 is a perspective view showing a manner in which the unmanned conveying machine on which a parts carriage is put approaches to a designation portion for designating supply or exchange of parts.

DETAILED DESCRIPTION OF THE PREFERRED EMBODIMENTS

Figure 1:
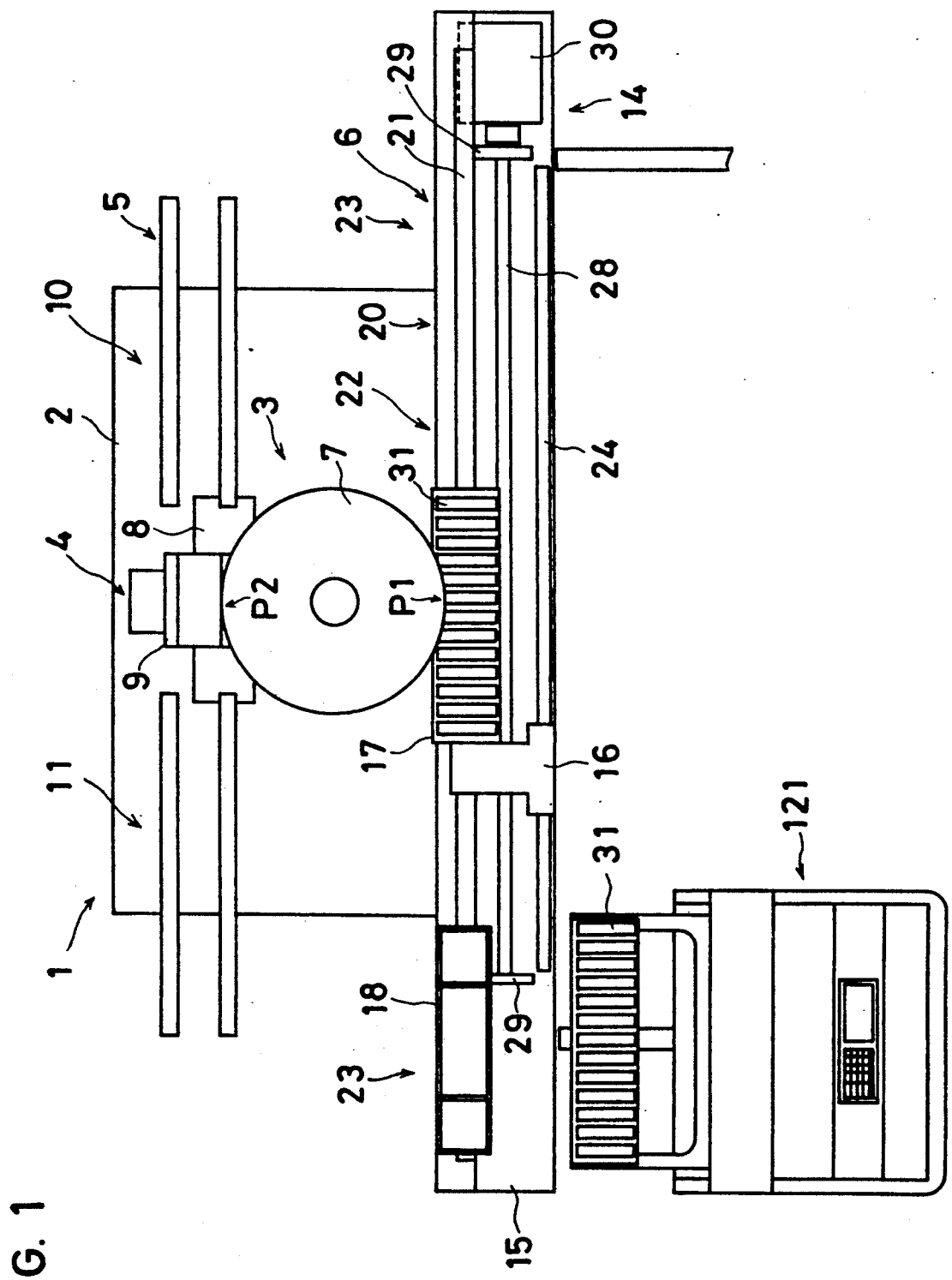
FIG. 1 is a plan view showing the schematic structure of a parts mounter.

FIG. 1 shows the schematic structure of a parts mounter 1 for mounting electronic parts on a circuit board. The parts mounter 1 comprises a main frame 2, a parts mounting portion 3, a board positioning portion 4, board conveying portion 5, and a parts feeding portion 6.

The parts mounting portion 3 is mainly composed of an index table 7 which indexes and rotates. The same number of parts mounting heads (not shown) as the number of times of indexing of the index table 7 are arranged on a periphery of the index table 7. The parts mounting head is used for taking out electronic parts from the parts feeding portion 6 when it reaches a parts taking-out position P1 by the indexing and rotation of the index table 7 and then, mounting the electronic parts on a board held in the board positioning portion 4 when it reaches a parts mounting position P2.

The board positioning portion 4 is mainly composed of an XY table 8. A pair of clamp rails 9 for sandwiching the board at two sides thereof to clamp the board are arranged above the XY table 8.

The board conveying portion 5 comprises a loader 10 and an unloader 11 which are arranged on both sides of the board positioning portion 4. A space is left between the loader 10 and the unloader 11 to the extent that the board positioning portion 4 can go in and out of the space. The loader 10 receives the board from an apparatus (not shown) in the preceding process and feeds the same into the board positioning portion 4. The unloader 11 receives from the board positioning portion 4 the board on which electronic parts have been mounted and feeds the same into an apparatus (not shown) in the succeeding process.

The parts feeding portion 6 is used for feeding electronic parts to the parts mounting portion 3 in the parts taking-out position P1, which has as its major elements a rail stand 15, a parts carriage 17 for holding electronic parts, and a carriage carrier 18 and a positioning block 16 which constitute a positioning device 14 of the parts carriage 17.

The structure of the parts feeding portion 6 will be described in detail with reference to FIGS. 1 to 8.

The rail stand 15 is a major element of the parts feeding portion 6 and is fixed on the main frame 2. A rail 21 constituting a track 20 of the parts carriage 17 is laid parallel with the board conveying portion 5 on the rail stand 15. A work station 22 of the parts carriage 17 is set in a central part of the track 20. In addition, carriage replacing stations 23 are set on both sides of the work station 22. The positioning block 16 is supported by a slider 25 which is movable on the rail 21 on its one side and is supported by a slider 27 which moves on a rail 24 laid parallel with the rail 21 on its other side (see FIGS. 4 and 5). Reference numeral 28 denotes a lead screw arranged between the rails 21 and 24 parallel with the rails, which is screwed into a nut (not shown) of the positioning block 16. Reference numeral 29 denotes a pair of bearings for supporting the lead screw 28 on the rail stand 15. A motor 30 fixed to the rail stand 15 is connected to one end of the lead screw 28.

Figure 2:
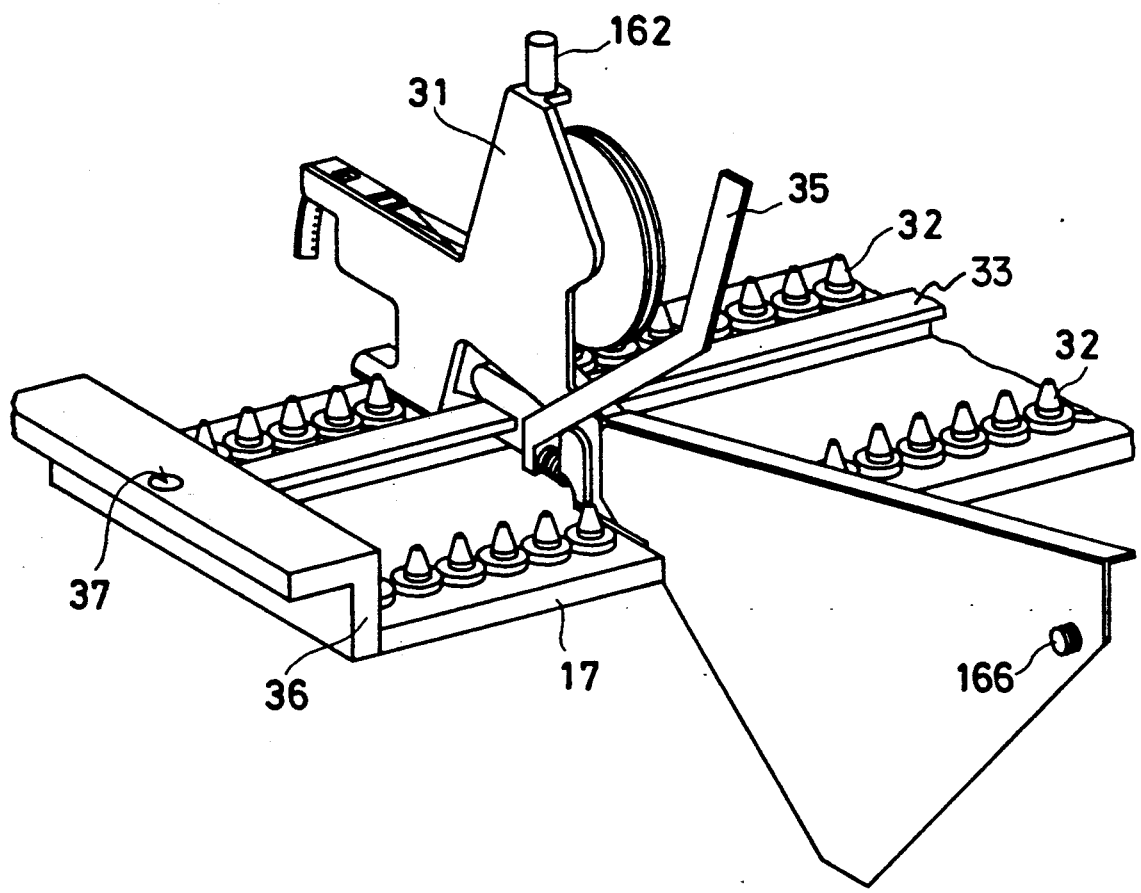
FIG. 2 is a perspective view showing the surface of a parts carriage.

The parts carriage 17 is adapted to have a plurality of parts feeding cassettes 31 detachably held thereon. As shown in FIG. 2, a plurality of pins 32 are equally spaced at both side edges of the surface of the parts carriage 17, and angle members 33 are arranged between the pins 32. The parts feeding cassette 31 has the same structure as that described in Japanese Patent Laid-Open Gazette No. 98199/1988, which is used for feeding a tape having electronic parts sealed therein at a pitch by power transmitted from the exterior and feeding the electronic parts one by one.

The parts feeding cassette 31 is mounted on the parts carriage 17 in such a manner that the worker rotates the clamp lever 35 which is urged in a clockwise direction in FIG. 2 by a spring of the parts feeding cassette 31 in a counterclockwise direction to ensure that a hook portion of the lower end of the clamp lever 35 is not brought into contact with the angle member 33, and the worker fills a hole (not shown) provided on the lower surface of the parts feeding cassette 31 around the pin 32, and thereafter, the worker returns the clamp lever 35 to engage the hook portion with the angle member 33.

Figure 3:
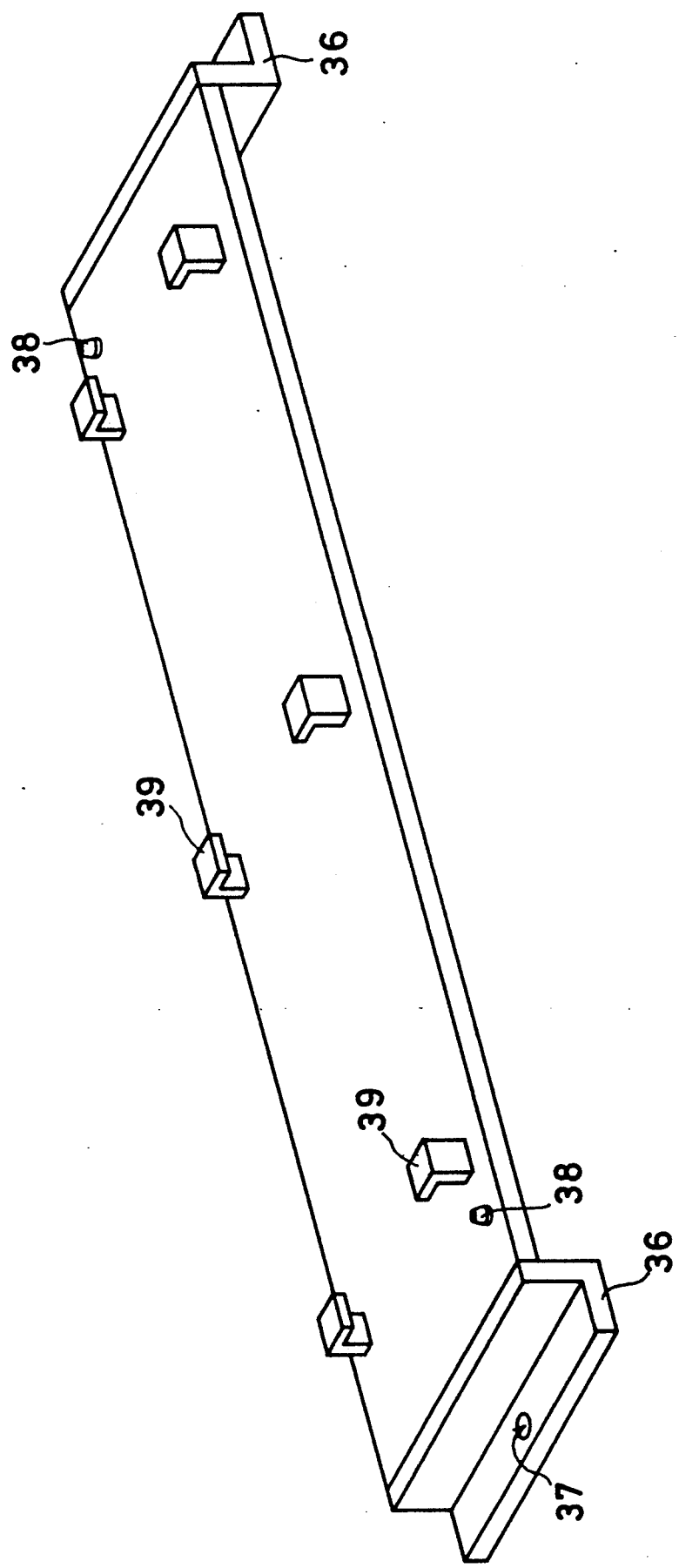
FIG. 3 is a perspective view showing the rear surface structure of the parts carriage.

Reference numeral 36 denotes a bracket mounted on a side end of the parts carriage 17, which has its projected portion provided with a through hole 37. The parts carriage 17 can be moved on the track 20 by mounting on the carriage carrier 18. FIG. 3 shows the reverse surface of the parts carriage 17. Pins 38 for regulating the position of the parts carriage 17 at the time of mounting on the carriage carrier 18 and three pairs of L-shaped hooks 39 which are engaged with clamping means as described later constructed on the carriage carrier 18 are fixed to the reverse surface of the parts carriage 17.

Two carriage carriers 18 are arranged on the track 20. In FIG. 1, one of the carriage carriers 18 shunts in the carriage replacing station 23, and the other carriage carrier 18 is positioned in the work station 22 with the parts carriage 17 being mounted thereon. These two carriage carriers 18 are symmetrical and thus, the structure of the carriage carrier 18 which shunts in the carriage replacing station 23 is described herein by way of example.

Figure 4:
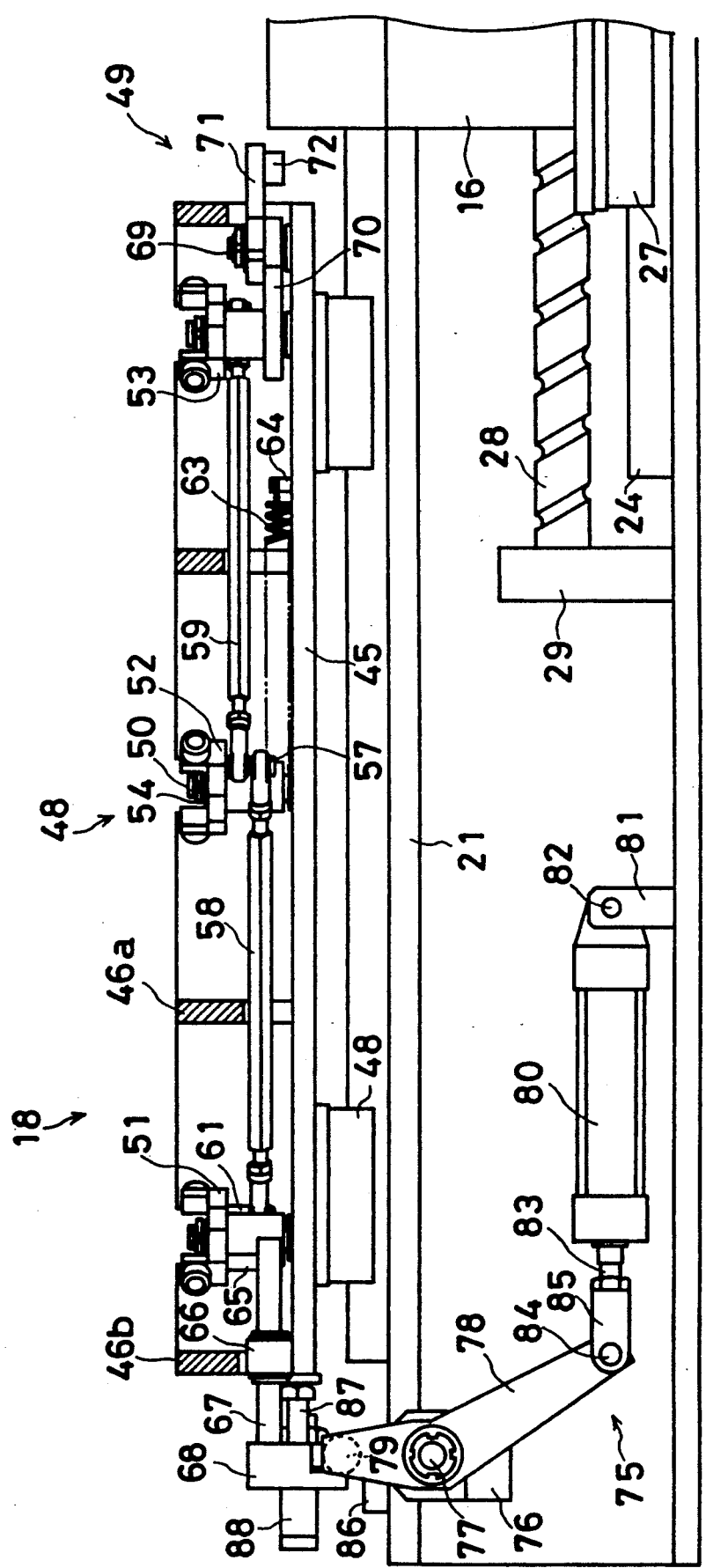
FIG. 4 is an elevational and partly sectional view showing the structure of a carriage carrier.

As shown in FIG. 4, a base 45 of the carriage carrier 18 is supported on the rail 21 by a slider 48. Two carriage supporting plates 46a and four carriage supporting plates 46b are combined with each other in a lattice shape and are fixed to the upper surface of the base 45. The parts carriage 17 is disposed at upper edges of the carriage supporting plates 46a and 46b, and the carriage supporting plate 46a is provided with a positioning hole 47 (see FIG. 5) to which the pin 38 on the parts carriage 17 is fitted. Holding means 48 of the parts carriage 17 and connecting means 49 of the positioning block 16 are constructed on the upper surface of the base 45.

In the holding means 48, bell cranks 51, 52 and 53 are rotatably mounted on three supporting shafts 50 which vertically rise from the base 45, respectively, and nuts 54 respectively prevent the bell cranks from slipping off. Projected portions which vertically rise are provided in both ends of two sides extending in the horizontal direction of each of the bell cranks 51, 52 and 53, and rollers 55 rotatable around a horizontal axis line are mounted on their outer surfaces. Reference numeral 56 (FIG. 6) denotes a gear mounted on the lower surface of the bell crank 53, which is used for transmitting the power to the connecting means 49. Respective one ends of connecting rods 58 and 59 are connected to one end of the bell crank 52 through a connecting pin 57. The connecting rod 59 crosses an alignment line of the supporting shaft 50 and reaches the bell crank 53 to be connected to one end of the bell crank 53 through a connecting pin 60. Similarly, the connecting rod 58 crosses the alignment line of the supporting shaft 50 and reaches the bell crank 51 to be connected to one end of the bell crank 51 through a connecting pin 61. A coil spring 63 is connected to the other end of the bell crank 52 through a hook pin 62. The other end of the coil spring 63 is connected to a hook pin 64 projected from the base 45. Consequently, the bell crank 52 is urged in the clockwise direction in FIG. 5 the bell crank 51 and 53 are urged in the counterclockwise direction. A supporting shaft 65 is mounted on the other end of the bell crank 51.

Reference numeral 66 denotes a bearing fixed to the base 45, which supports a sliding rod 67 parallel with the track 21. One end of the sliding rod 67 is connected to the supporting shaft 65. A hook 68 is mounted on the other end of the sliding rod 67. In the connecting means 49, a supporting shaft 69 is provided upright adjacent to the supporting shaft 50 supporting the bell crank 53 in the base 45, a lever 71 to which a gear 70 is fixed is rotatably mounted on the supporting shaft 69, and a nut 54 prevents the lever 71 from slipping off in the same manner as that of the bell cranks. The gear 70 is engaged with the gear 56 fixed to the bell crank 53. When the bell crank 53 is rotated, the lever 71 is rotated in the opposite direction to that of the bell crank 53. A part of the lever 71 is projected from the carriage carrier 18, and a roller 72 rotatable around a vertical axis is mounted on its end.

Reference numeral 75 denotes driving means for operating the holding means 48 in the carriage replacing station 23. Such a driving means 75 is also arranged in the other table replacing station 23. The driving means 75 has a bracket 76 fixed to a vertical wall of the rail stand 15. A supporting shaft 77 is projected in the horizontal direction from the bracket 76, and a bell crank 78 is rotatably mounted thereon and a nut 91 prevents the bell crank 78 from slipping off. A roller 79 is mounted on an upper end of the bell crank 78.

Reference numeral 80 denotes an air cylinder for driving the bell crank 78, which is attached to a bracket 81 fixed to the rail stand 15 through a pin 82. A joint 85 is mounted on a tip end of a sliding rod 83 of the air cylinder 80, and a lower end of the bell crank 78 is attached thereto through a pin 84. Reference numeral 86 designates a bracket attached to the rail stand 15, on which a stopper bolt 87 and a shock absorber 88 are mounted.

Figure 5:
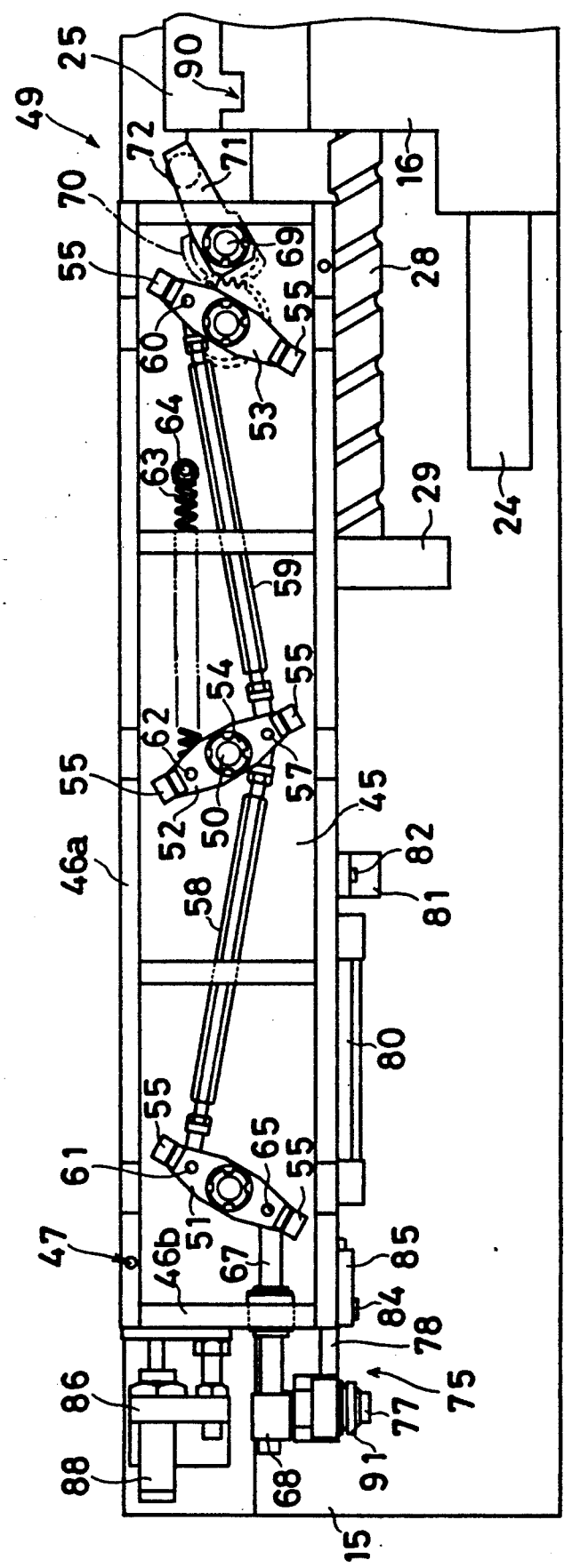
FIG. 5 is a top plan view showing a portion of the carriage carrier that is shown in FIG. 4.
Figure 6:
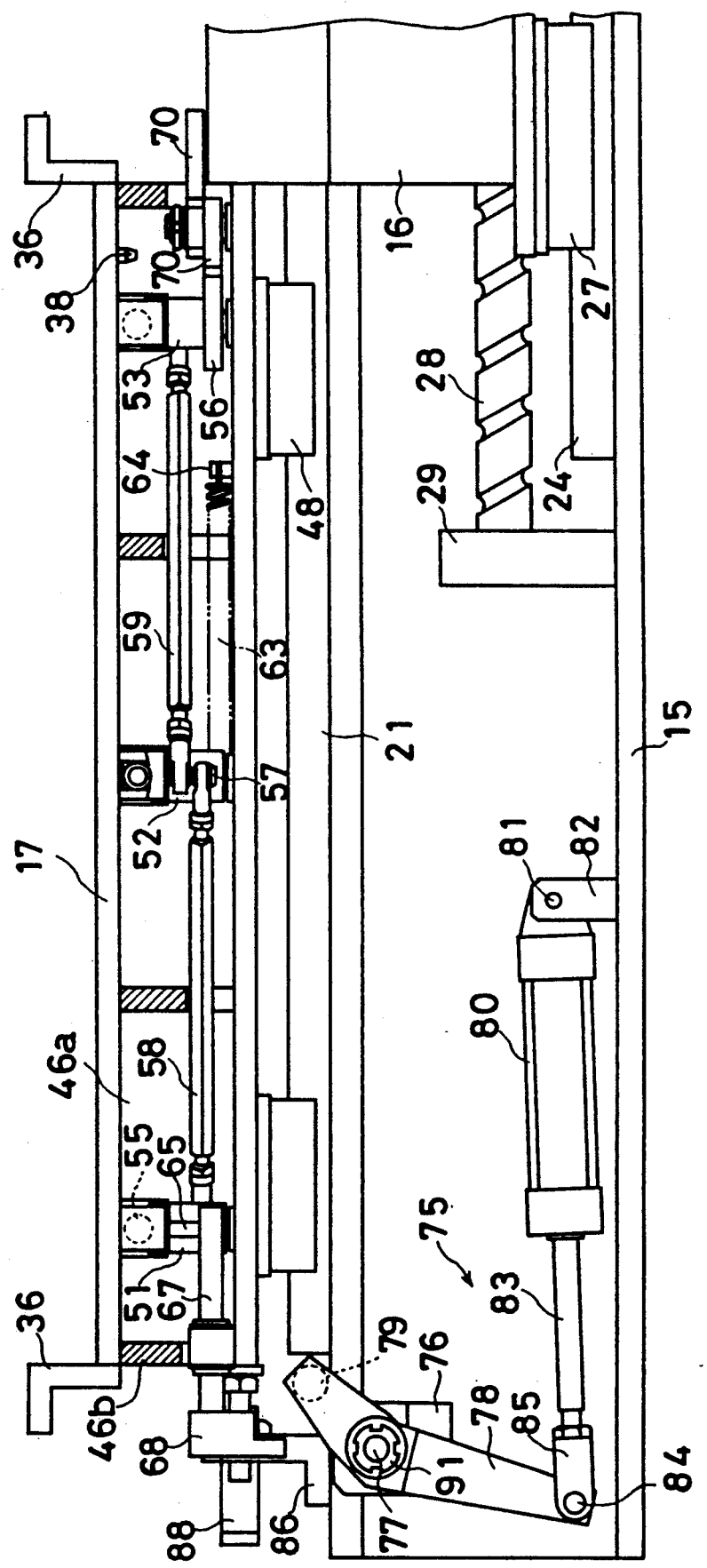
FIG. 6 is an elevational and partly sectional view showing a state where the carriage carrier holds the parts carriage and the parts carriage is connected to a positioning block.
Figure 7:
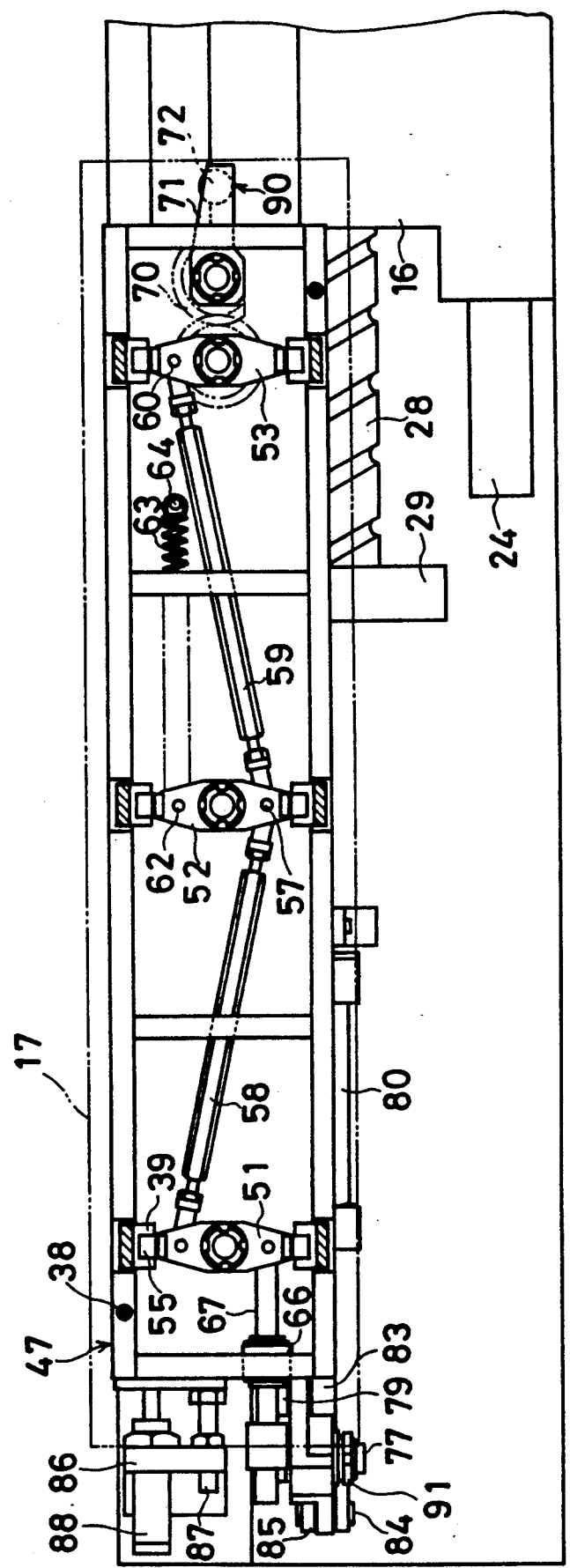
FIG. 7 is a top plan view showing the state shown in FIG. 6.

In FIGS. 4 and 5, the roller 79 in the driving means 75 is pressed on the hook 68 in the holding means 48, the sliding rod 67 is slid in the direction of a termination of the rail stand 15, and the carriage carrier 18 is pressed against the stopper bolt 87. Furthermore, in the holding means 48, the bell cranks 51, 52 and 53 are rotated through a constant angle against the urging force of the coil spring 63 by the sliding of the sliding rod 67. The lever 71 in the connecting means 49 is rotated through a constant angle to a position where it is not engaged with the positioning block 16 by the rotation of the bell crank 53. In a case where the parts carriage 17 is disposed on the carriage carrier 18 by an unmanned conveying machine 121 as described later and then, parts are fed by the parts carriage 17, when the positioning block 16 approaches the carriage carrier 18, the driving means 75 rotates the bell crank 78 in the clockwise direction to release the restraint of the lever 67. The bell cranks 51, 52 and 53 in the holding means 48 are rotated by the urging force of the coil spring 63, so that the rollers 55 run onto horizontal portions of the hooks 39 on the lower surface of the parts carriage 17. Consequently, the parts carriage 17 is prevented from being floated up and is completely held in the carriage carrier 18. At the same time, the lever 71 in the connecting means 49 is rotated in the clockwise direction in FIG. 5 by the rotation of the bell crank 53 and is snapped into a concave portion 90 provided in the positioning block 16 (see FIGS. 6 and 7). Thereafter, the positioning block 16 tows the parts carriage 17, to place a desired parts feeding cassette 31 in the parts taking-out position P1.

Figure 12:
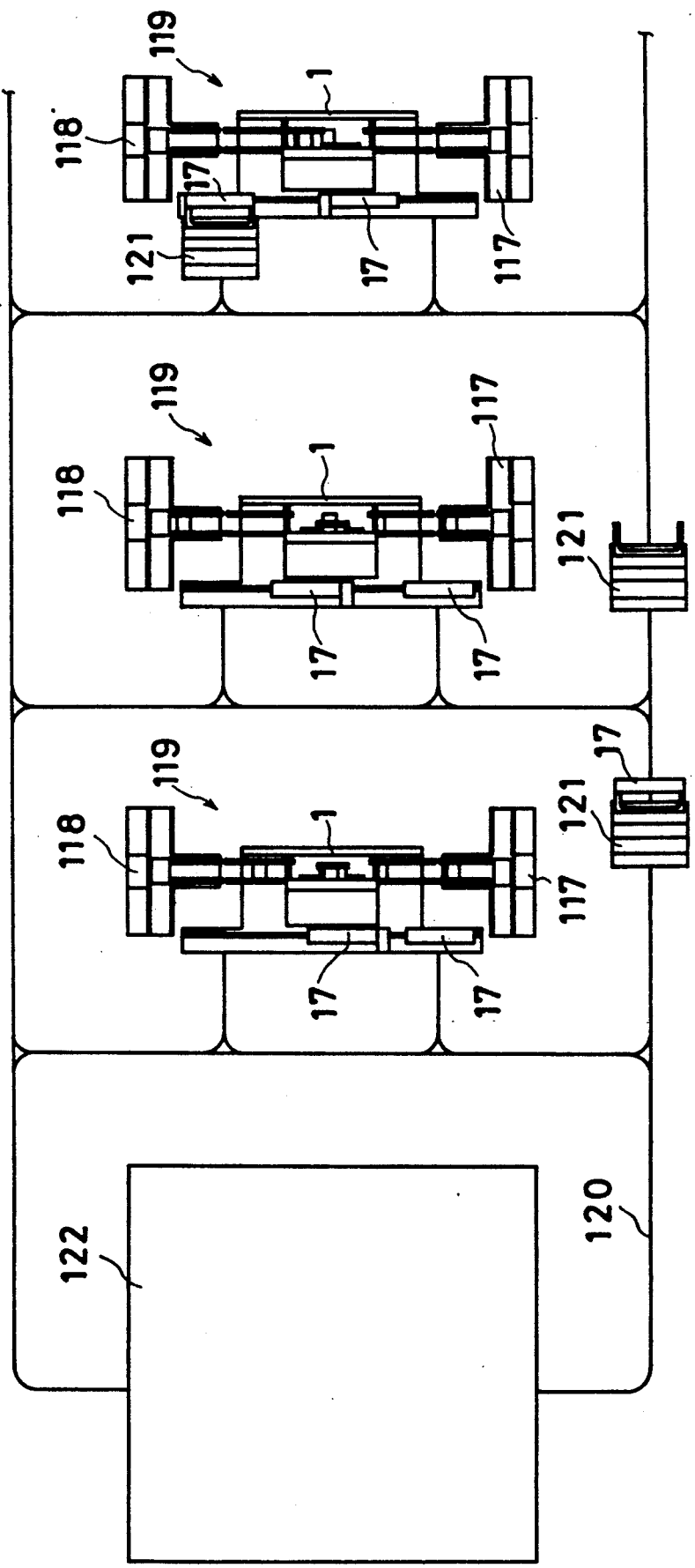
FIG. 12 is a schematic plan view showing a parts feeding system.

The construction of a parts feeding system 116 will be described with reference to FIGS. 12 and 13. Reference numeral 119 denotes a board assembly line which comprises a parts mounter 1, a board feeding machine 117 for feeding a board to the parts mounter 1 and a board containing machine 118 for containing the board on which parts are mounted by the parts mounter 1. The parts feeding system 116 has as its major elements an unmanned conveying machine 121 which is moved using as a guide a movement track tape 120 affixed to the periphery of the board assembly line 119, a parts carriage 17 as described above, a logistics base 122 for the unmanned conveying machine 121 which is provided in a halfway part of the movement track tape 120, and a parts managing portion 123 which is arranged inside of the logistics base 122.

Figure 8:
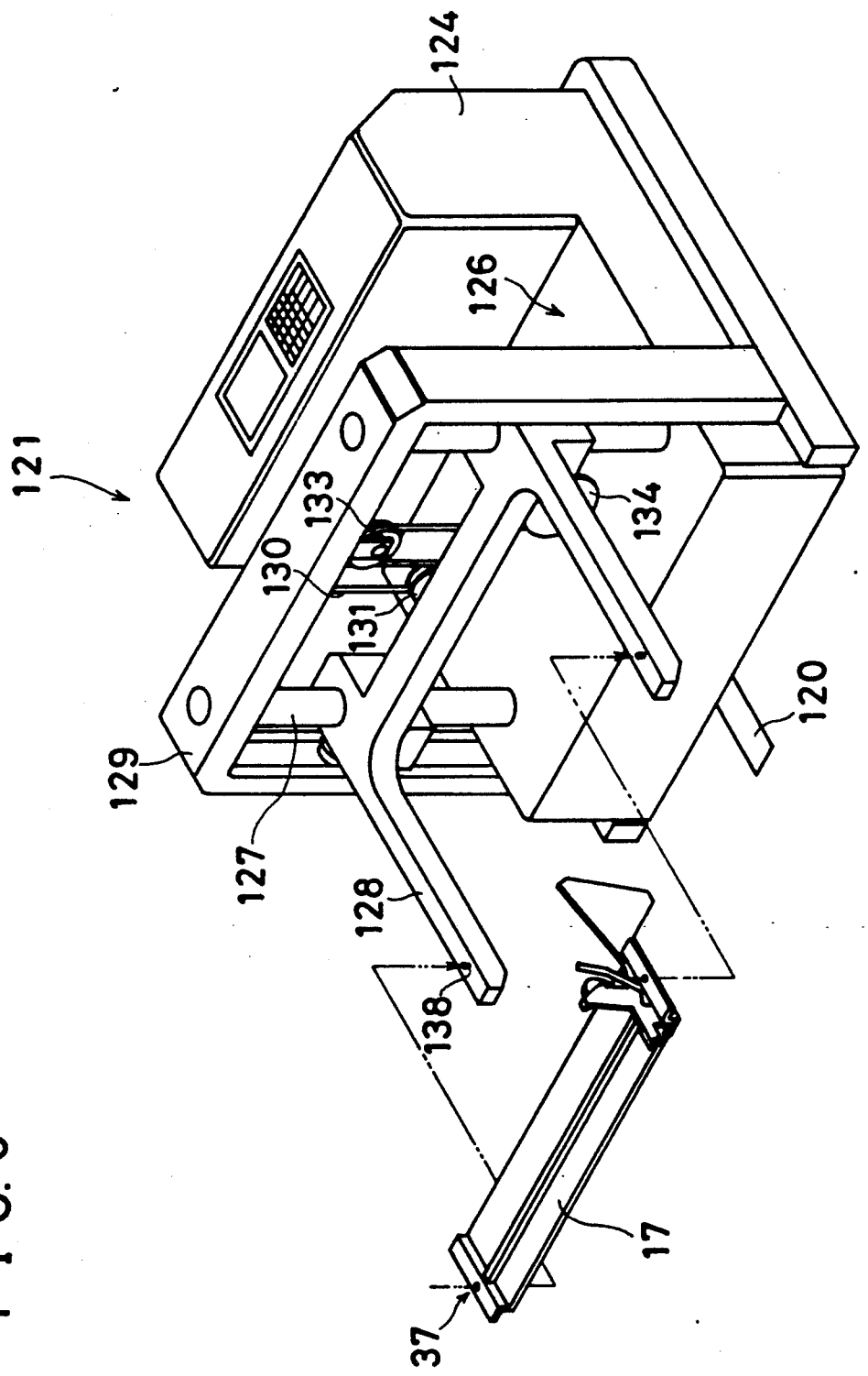
FIG. 8 is a perspective view showing the structure of an unmanned conveying machine.

The structure of the unmanned conveying machine 121 will be first described with reference to FIG. 8. The unmanned conveying machine 121 is so adapted that a lift 125 is installed on a mobile vehicle 124 comprising track tape detecting means (not shown). The mobile vehicle is moved utilizing a battery as a power source. The lift 125 is so adapted that a pair of guide posts 127 rises from a bed 126 of the mobile vehicle 124 and a fork 128 is supported thereon such that it can be raised and lowered. An upper part of the guide post 127 is supported on a horizontal portion of a U-shaped bridge 129 attached across the bed 126 of the mobile vehicle 124.

Reference numeral 130 denotes a steel rope having its one end connected to the horizontal portion of the bridge 129. The steel rope 130 is wound around a moving pulley 131 attached to the fork 128 and a fixed pulley 133 supported on the horizontal portion of the bridge 129 through a bracket 132 and is connected to a winding drum 134 which is rotated by a not-shown motor arranged in the bed 126. Consequently, the fork 128 is moved up and down by the rotation of the winding drum 134. A positioning pin 138 is mounted on the upper surface of a tip end of the fork 128. The parts carriage 17 is disposed on the carriage carrier 18 with the through hole 37 being fitted to the positioning pin 138.

Figure 9:
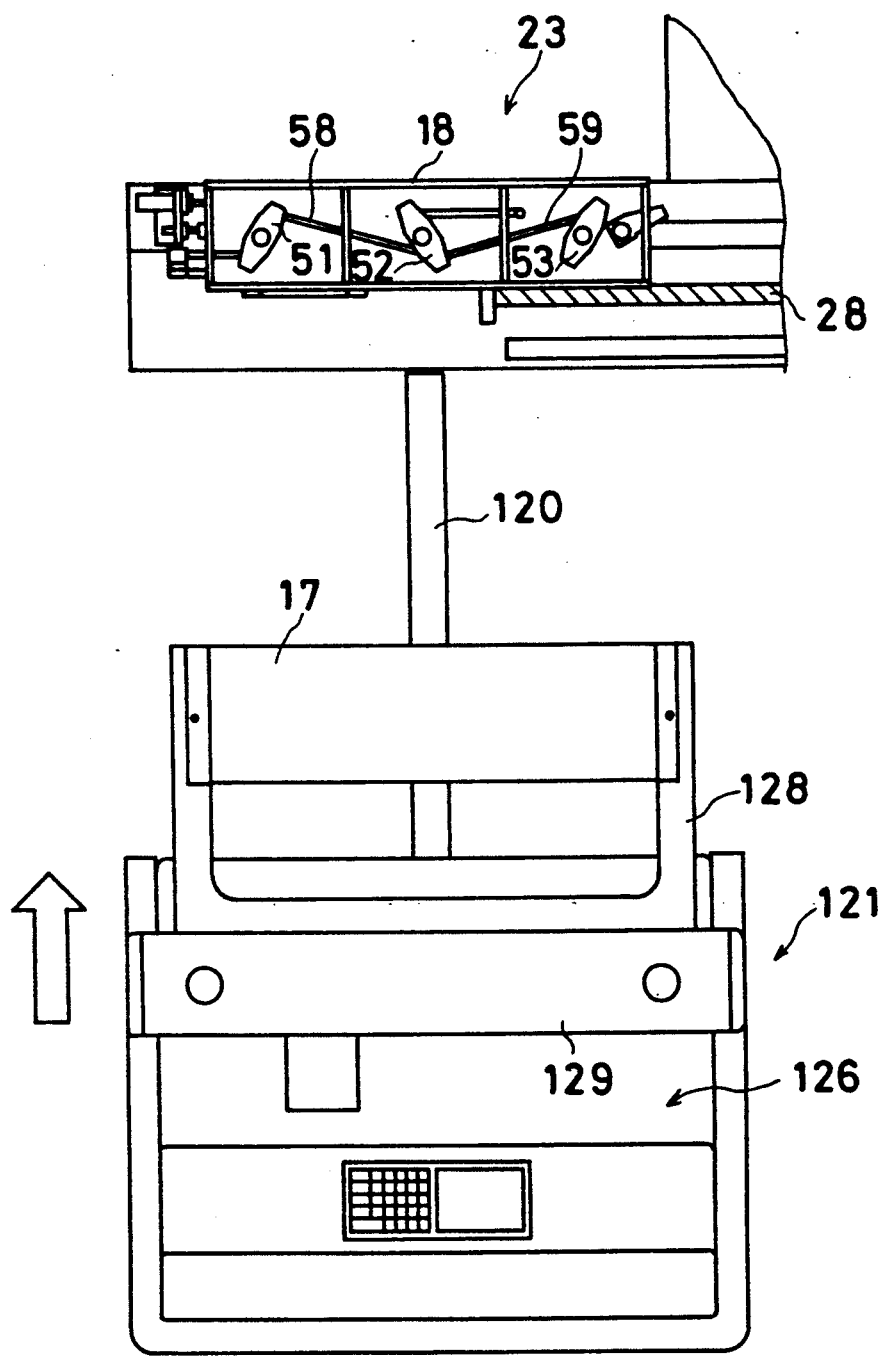
FIG. 9 is a top plan view showing a state where the unmanned conveying machine on which the parts carriage is disposed approaches the carriage carrier.
Figure 10:
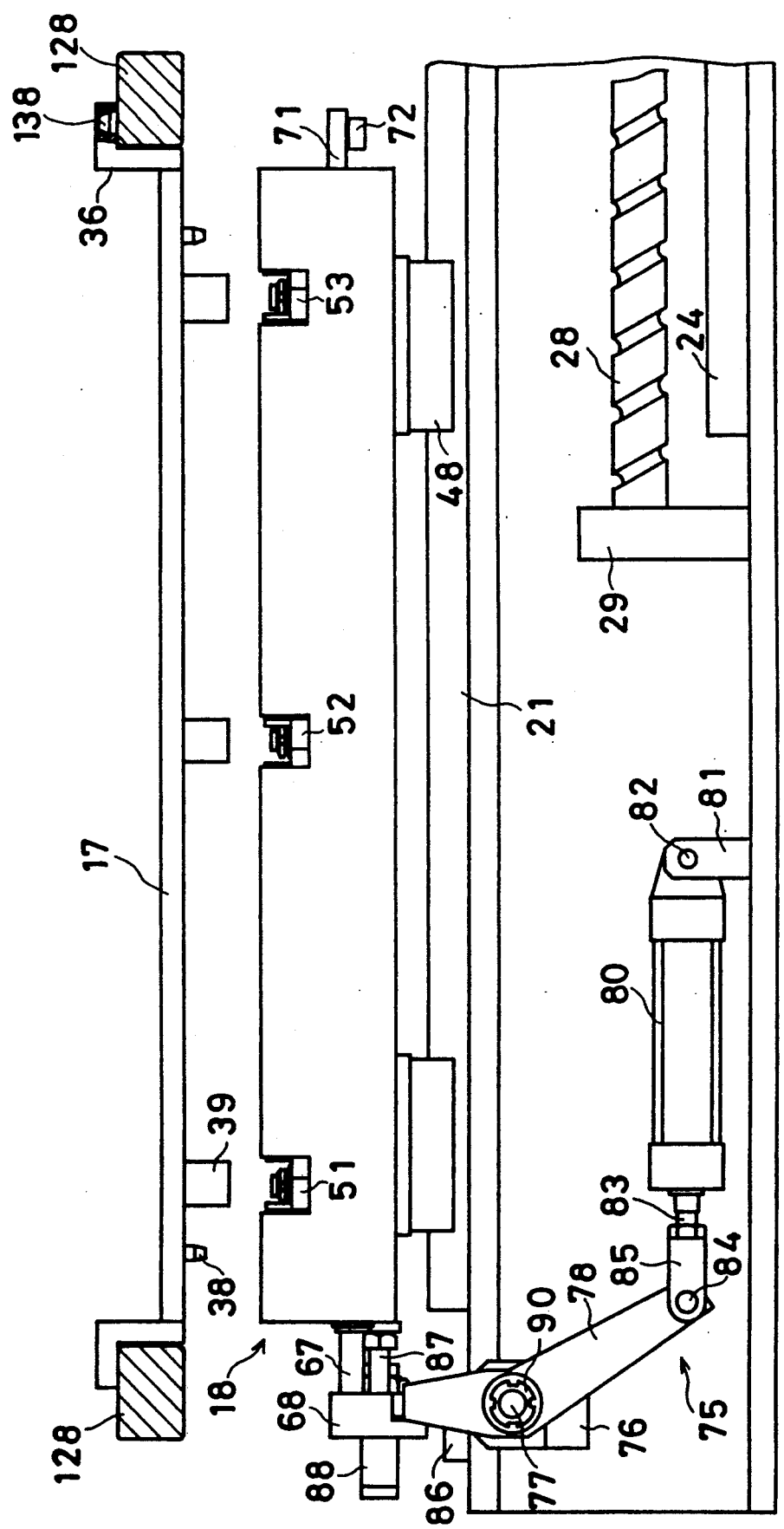
FIGS. 10 and 11 are elevational and partly sectional views showing a series of operations of the unmanned conveying machine disposing the parts carriage on the carriage carrier.
Figure 11:
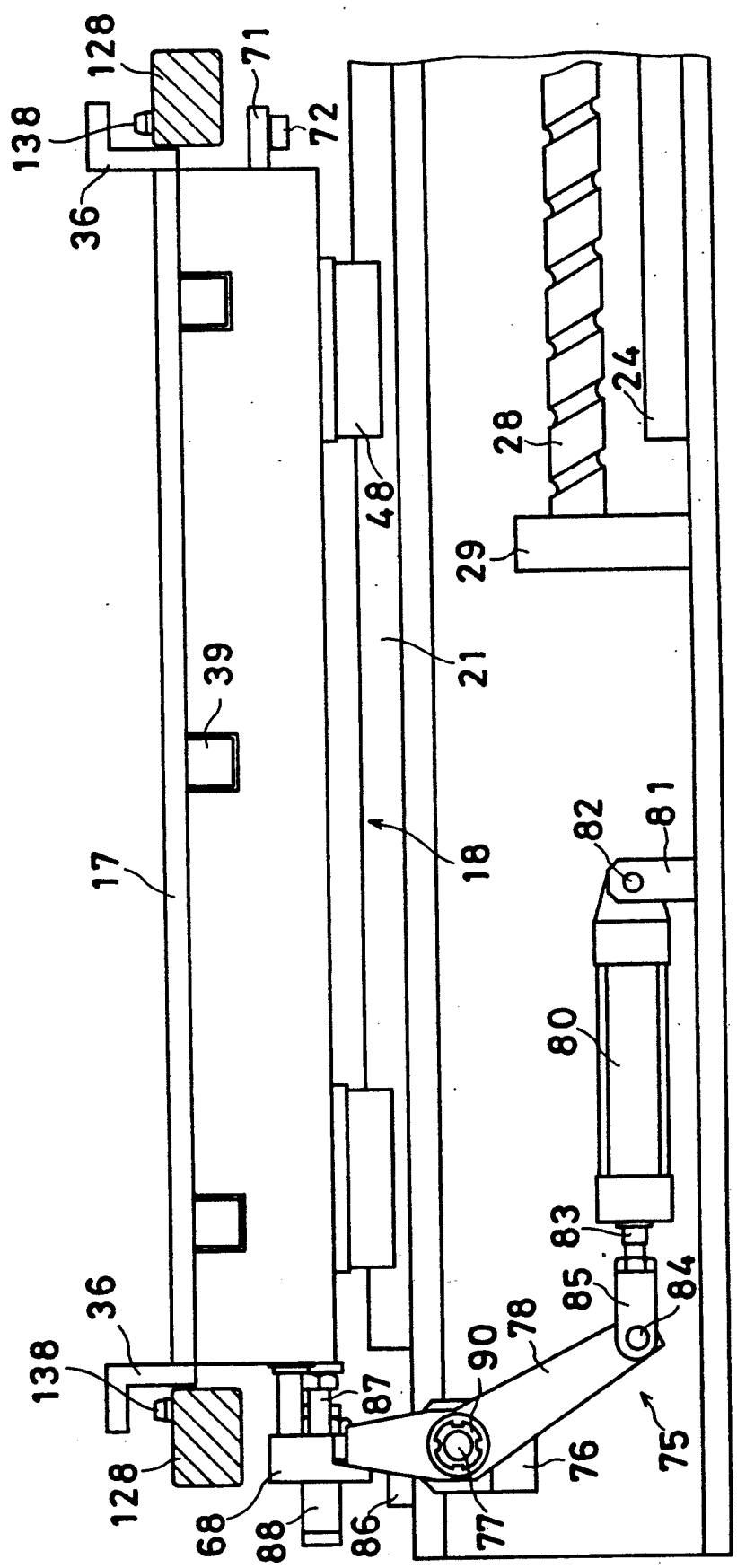

An operation of the unmanned conveying machine 121 disposing the parts carriage 17 on the carriage carrier 18 will be described with reference to FIGS. 9 and 11. The unmanned conveying machine 121 approaches the carriage replacing station 23 which is a destination while moving along the movement track tape 120. The moving path is commanded by well-known means such as radio and optical communication from a movement control portion 149 for controlling the movement of an unmanned conveying machine shown in FIG. 15. At this time, the unmanned conveying machine 121 supports the parts carriage 17 in a position higher than that of the carriage carrier 18 (see FIG. 9). The unmanned conveying machine 121 is stopped when the parts carriage 17 arrives directly over the carriage carrier 18 (see FIG. 10). Then, the unmanned conveying machine 121 lowers the fork 128 to mount the parts carriage 17 on the carriage carrier 18. The fork 128 is lowered until the positioning pin 138 comes off the through hole 37 of the parts carriage 17 (see FIG. 11). Thereafter, the unmanned conveying machine 121 returns to the logistics base 122 as described later.

A series of operations of the unmanned conveying machine 121 for feeding the parts carriage 17 to the parts mounter 1 will be described with reference to FIGS. 16 to 20. A parts carriage 17a which is not related to feeding of parts waits in a carriage replacing station 23 on the left side. A parts carriage 17b which is to be used is feeding parts on the carriage carrier 18 which is towed by the positioning block 16 (see FIG. 16). When parts in the parts carriage 17b run out, the positioning block 16 feeds the parts carriage 17b into a carriage replacing station 23 on the right side and alternatively, moves to the left side to be connected to the parts carriage 17a which is waiting. The unmanned conveying machine 121 approaches the parts carriage 17b (see FIG. 17). The carriage carrier 18 positioned in the carriage replacing station 23 releases holding of the parts carriage 17b.

Figure 18:
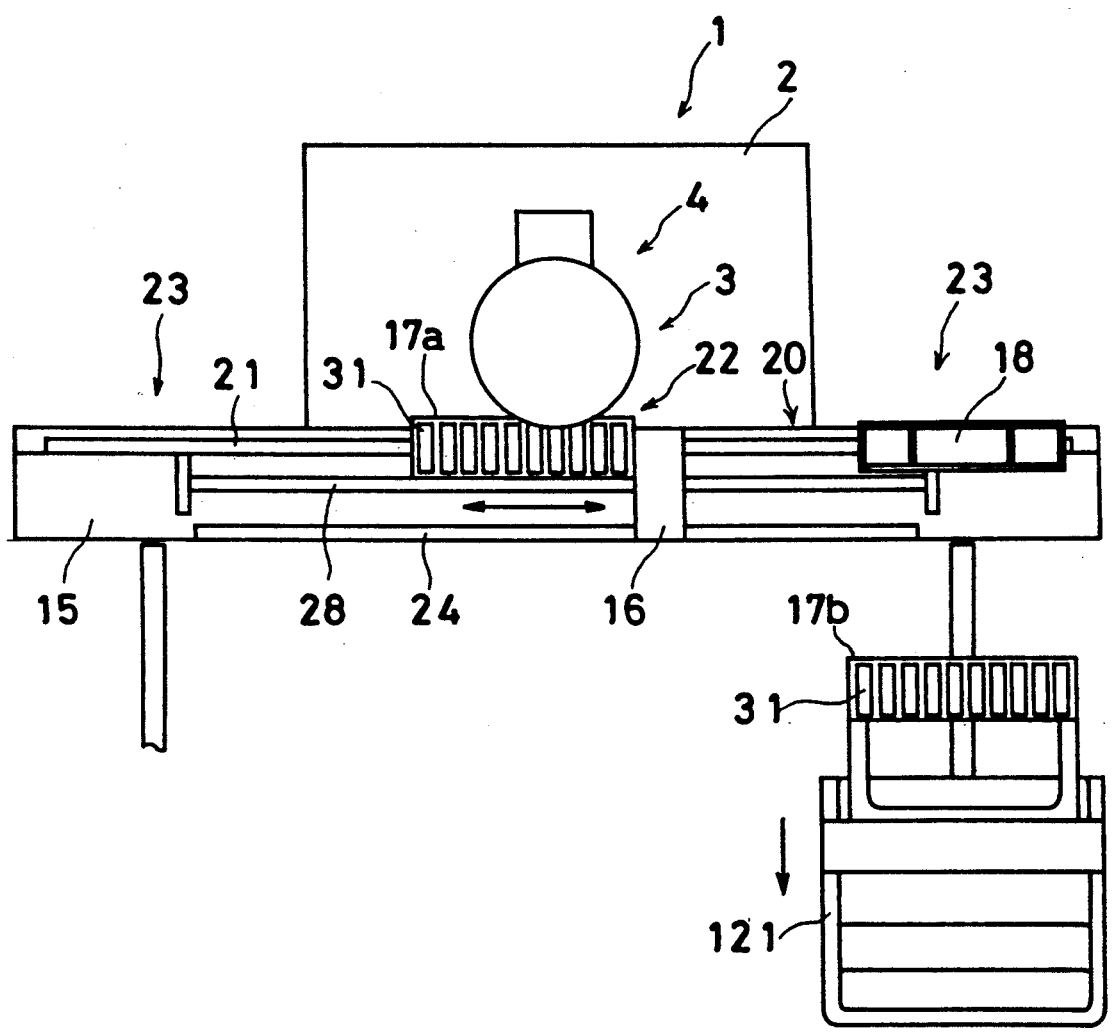
Figure 19:
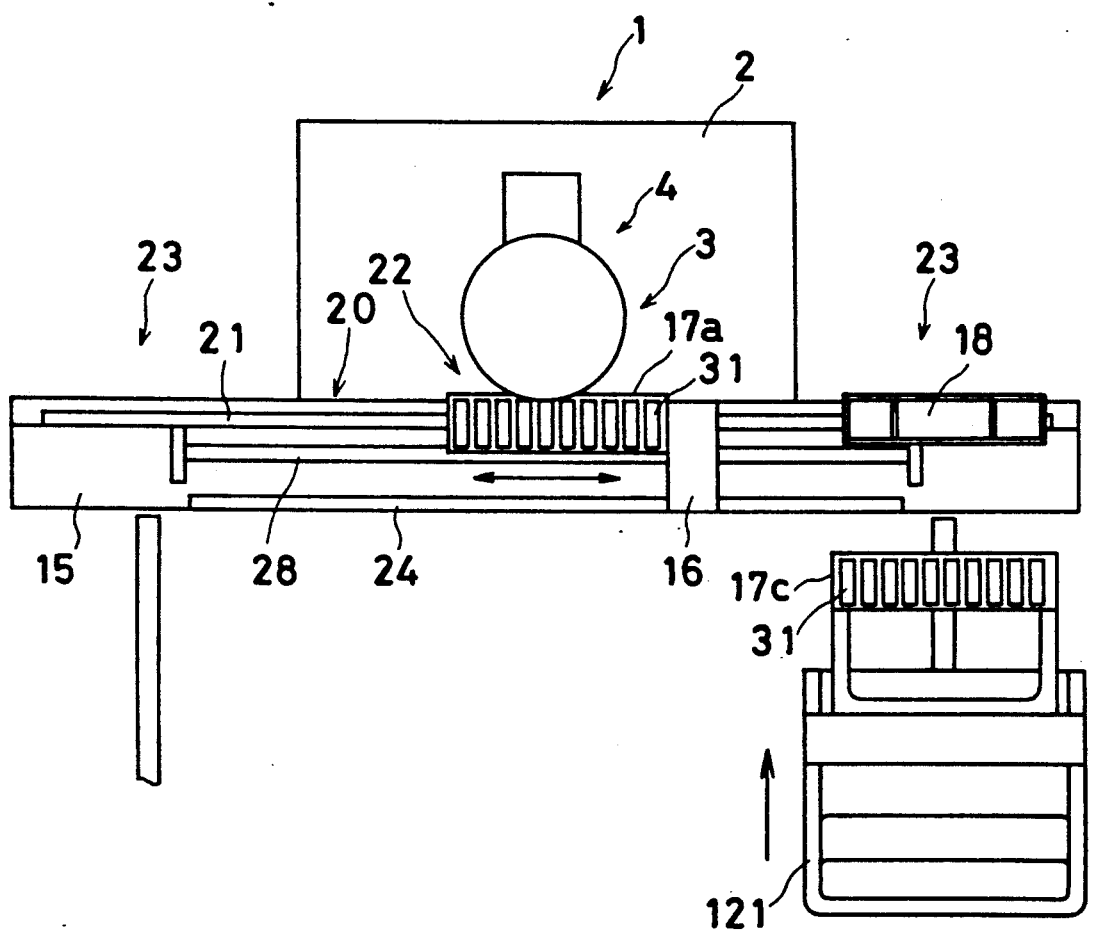
Figure 20:
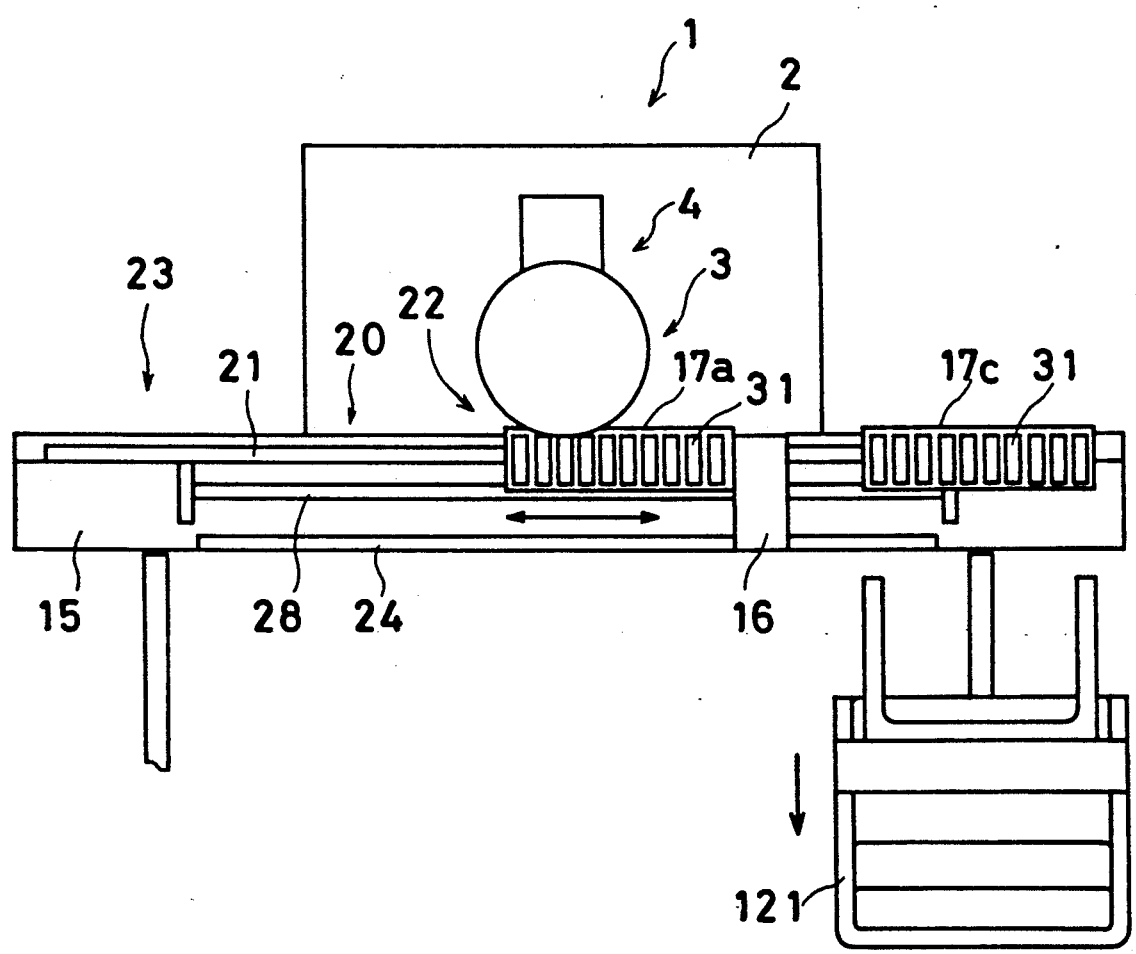

The unmanned conveying machine 121 retrieves the parts carriage 17b from the carriage carrier 18 and returns to the logistics base 122 (see FIG. 18). The positioning block 16 is connected to the parts carriage 17a so that the parts carriage 17a starts to feed parts. Instead, another unmanned conveying machine 121, on which is disposed a parts carriage 17c full-equipped with required electronic parts, approaches the carriage carrier 18 (see FIG. 19). The unmanned conveying machine 121 is called back to the logistics base 122 after disposing the parts carriage 17c on the carriage carrier 18 (see FIG. 20).

The logistics base 122 is provided in the halfway part of the movement track tape 120, as described above. The unmanned conveying machine 121 takes a parts carriage 17 requiring supply or exchange of parts in the logistics base 122, and takes a parts carriage 17 having parts supplied or exchanged out of the logistics base 122 to feed the same to a predetermined parts mounter 1.

Figure 15:
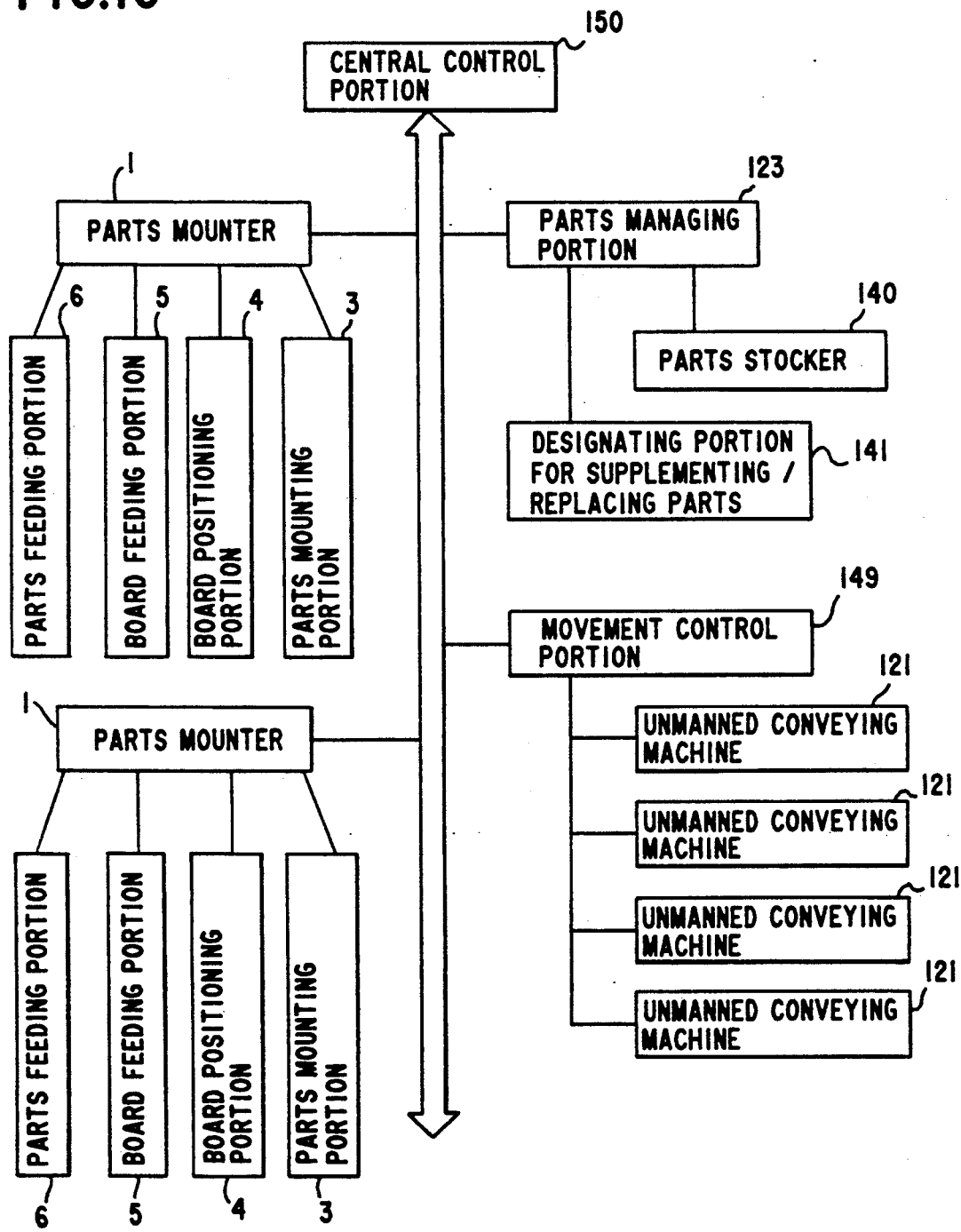
FIG. 15 is a block diagram showing the parts feeding system.
Figure 16:
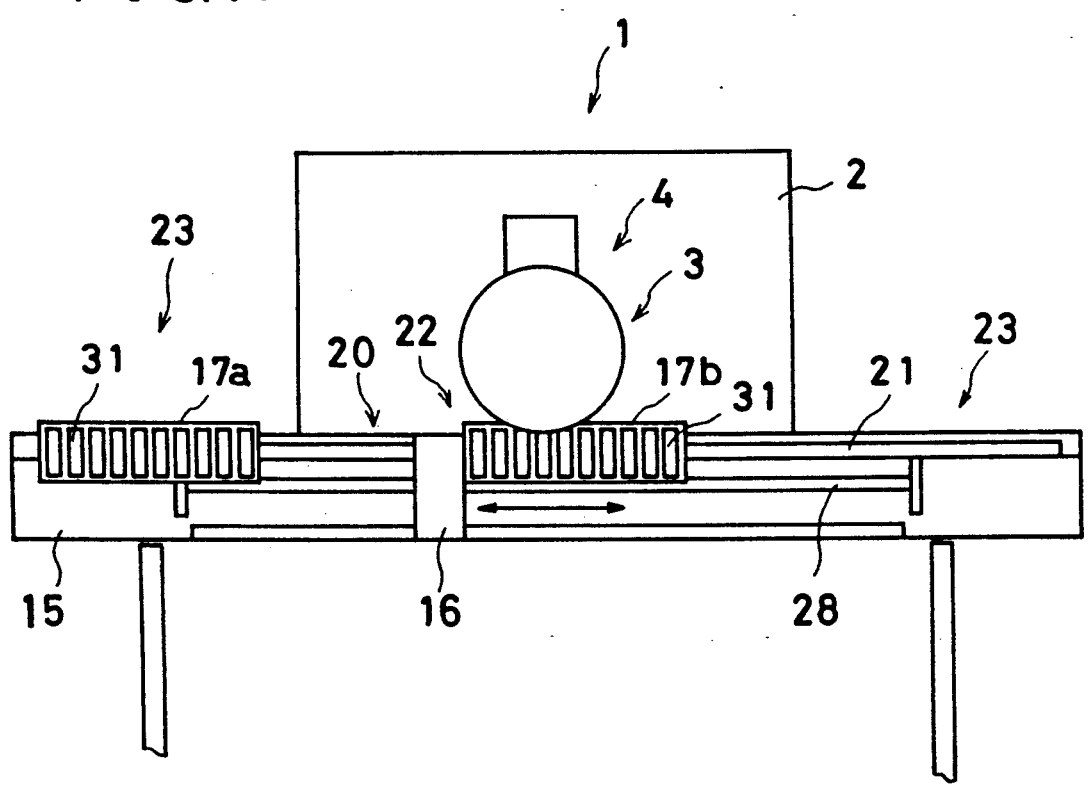
FIGS. 16 to 20 are typical plan views showing a series of operations of the unmanned conveying machine feeding the parts carriage to the parts mounter.
Figure 17:
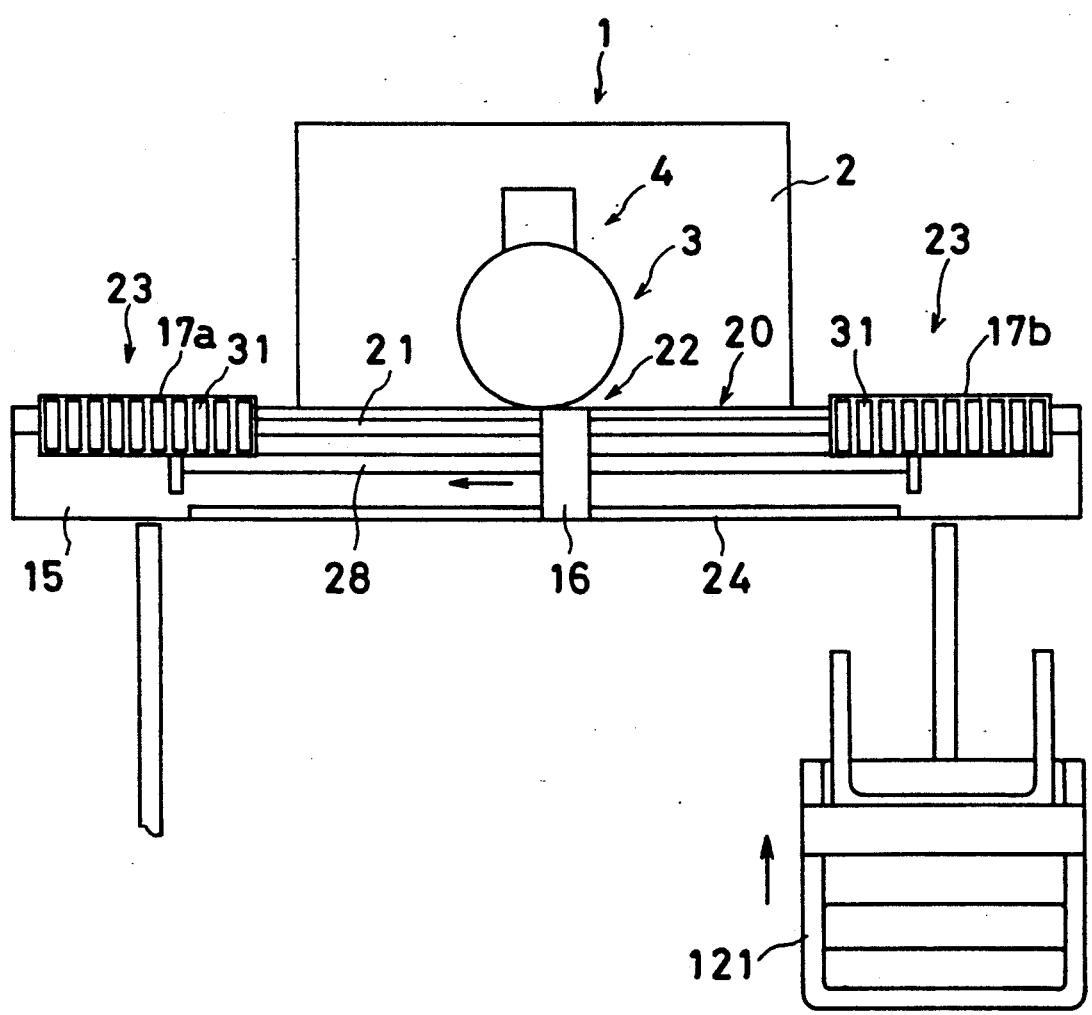

The parts managing portion 123 shown in FIG. 15 comprises a parts stocker 140 arranged inside of the logistics base 122 and a designation portion 141 for designating supply or exchange of parts. The parts stocker 140 stores all kinds of electronic parts intended to be used by the parts mounter 1 and the necessary number of the parts feeding cassettes 31. This parts stocker 140 is an automated stocker which is provided with a plurality of racks 143 movable along an endless rail 142 by the automatic control, and the above described electronic parts and the parts feeding cassettes 31 are kept by the racks 143.

The designation portion 141 is composed of a CRT display device 144 displaying and notifying to the worker the working content with respect to the parts carriage 17 which was conveyed by the unmanned conveying machine 121, and a display console 147 provided with lamps 145 for indicating the working places and confirmation switches 146 for confirming the completion of the work on its upper portion. Shelves 148 which are used for putting the parts carriages 17 thereon are projected from the display console 147. In addition, there are provided the same number of the lamps 145 and the confirmation switches 146 as the number of the parts feeding cassettes 17.

Next, the work content of the parts managing portion 123 will be described. The unmanned conveying machine 122 which conveyed the parts carriage 17 to the logistics base 122 is stopped so that the parts carriage 17 becomes parallel with the display console 147 (see FIG. 14). Then, the unmanned conveying machine 121 departs this place in accordance with the command from a movement controlling portion 149 shown in FIG. 15 while the parts carriage 17 is put on the shelf 148.

Thereafter, the lamp 145 corresponding to the parts feeding cassette 31 which is a problem is driven, and the content of the work to be performed to this parts feeding cassette 31 is displayed on the CRT display device 144. The worker takes out parts from the parts stocker 140 to supply the parts in the parts feeding cassette 31, or takes out the parts feeding cassette 31 from the parts stocker 140 to replace the parts feeding cassette 31.

The central control portion 150 shown in FIG. 15 gives the command to the parts managing portion 123 so as to move the rack 143 which becomes necessary for that work to a vicinity of the worker in accordance with the content displayed on the CRT display device 144. The worker pushes the confirmation switch 146 upon the completion of the work to send a work completion signal to the central control portion 150. In response thereto, the central control portion 150 turns the lamp 145 corresponding the place wherein the work has been completed off, and the display content of the CRT display device 144 is changed, and the rack 143 which becomes necessary for the next work is brought at the position in the vicinity of the worker.

When the parts carriage 17 is full-equipped with parts by continuing such work, the unmanned conveying machine approaches to pick-up the parts carriage 17 from the shelf 148, going to the parts mounter 1 which requires this parts carriage 17. However, the parts mounter 1 which takes out the parts carriage 17 is not necessarily the targeted place for the unmanned conveying machine 121.

Reference numeral 151 denotes a charge station, in which a plurality of battery chargers 152 are arranged. In the charge station 151, the unmanned conveying machine 121 which is insufficient in voltage is connected to the battery chargers 152 to be charged.

FIG. 15 shows the connecting construction of elements. As can be understood from this connecting construction, the central control portion 161 is used for supervising and controlling the respective parts mounters 1, the parts managing portion 123 and the movement control portion 119 of movement of the unmanned conveying machines 121, grasping information as to what parts are required in any one of the parts mounters 1, causing the parts managing portion 123 to prepare the parts carriage 17 in conformity with the information, and causing the movement control portion 149 to assemble a movement program for the unmanned conveying machine 121.

More specifically, in a first step, a production schedule for assembling electronic circuit boards of this day is communicated to the central control portion 150.

Next, the central control portion 150 computes what kind of the board is to be assembled by what board assembling line of the parts mounter on the basis of the ability or capacity of each parts mounter 1 and the present parts in order to seek the most efficient way. Data of the present parts includes information about the number of each kind of parts which are supplied to each parts mounter 1 at a timing, and thereafter, the number of the parts which were taken-out is counted. Such data is transferred to the parts mounter, and therefore, the parts mounter itself knows the number of the parts remaining therein, and such information is communicated to the central control portion 150 at every moment or at a predetermined communication timing.

Thereafter, the preparation of the assembling is started in each parts mounter 1 in accordance with the instructions from the central control portion 150. The parts mounter 1 automatically performs the preparation in accordance with the automated capability of itself. For example, if the parts mounter 1 has an automatic adjustment function of the width of the board guide rails, it adjusts the width of the guide rails to be equal to a width of a board which becomes to be assembled. In addition, the parts mounter 1 requires to be supplied with a designated board to a board supplying portion (not shown). However, as to portions to which no automated capability reaches, the worker performs the preparation in accordance with the instructions by the central control portion 150.

In the next step, in accordance with the present parts data and the assembling schedule being assigned to the parts mounter 1, the parts mounter 1 checks what kind of parts is missing presently or when the kind of parts would run out. The parts mounter 1 communicates a result of the check to the central control portion 150, whereby the central control portion 150 can design a schedule by which the parts carriage 17 of what parts mounter 1 is to be changed at what timing.

Such a schedule for replacing the parts carriage is communicated to the movement control portion 149. The movement control portion 149 which functions as a subsystem designs a movement schedule of the unmanned conveying machine 121 by taking the position where each unmanned conveying machine 1 is present into consideration.

The movement schedule of the unmanned conveying machine is communicated to the central control portion 150 which communicates to the parts managing portion 123 the movement schedule together with the additional information. The additional information includes not only information on how many parts of each kind of parts should be supplied in the parts carriage 17 but also information as to the order by which each kind of parts is taken-out. Such an order is evaluated by the program in accordance with the mounting order of the parts, and may be computed by the parts mounter 1 and the central control portion 150.

The parts managing portion 123, determines the operating sequence of the racks 143, the displaying content of the CRT display device 144, and the operating sequence of the lamps 145 on the basis of the above described information.

The central control portion 150 outputs the starting instruction of the work to the parts mounter 1 capable of mounting by using only the present parts. In a case where a line is constructed by a plurality of parts mounters 1, the line should be stopped as a whole when any one of them is incapable of working; however, in such a case, if a buffer function is provided in the line, it is possible to start the parts mounters 1 which are capable of working.

Thereafter, the movement of the unmanned conveying machine 121 are started. One of the unmanned conveying machine 121 goes to the designated pats mounter 1 to unload the parts carriage 17. In this case, an unmanned conveying machine 121 which has supplied the parts carriage to the parts mounter and thus loads no parts carriage is designated. The parts carriage loaded on the unmanned conveying machine may be temporarily put on a carriage stocker (not shown) in order to make the unmanned conveying machine 1 be unloaded. In addition, another unmanned conveying machine 1 goes from the parts managing portion 123 to the parts mounter 1 while the parts carriage which is full-equipped with the designated parts is loaded on the unmanned conveying machine 1. In a case where the unmanned conveying machine 121 is guided by radio waves or by an electromagnetic inducing line buried in the floor, the unmanned conveying machine 1 which has delivered the parts carriage 17 to the parts mounter 1 waits at a proper position in the movement track until the instruction for taking-out the parts carriage is input thereto. However, in a case of a system in which a movement program is set to the unmanned conveying machine 121 in the logistics base 122 for each movement thereof, the unmanned conveying machine 121 immediately returns to the logistics base 122.

In the parts managing portion 123, messages which announce what kinds of work should be performed with respect to the parts carriage 17 as arrived are sequentially indicated to the worker through the CRT display device 144 and the display console 147. The accomplishment of the whole work is influenced by the speed of the supply or exchange of the parts in the logistics base 122. The parts managing portion grasps the progress of the work through the operations of the confirmation switches 146, and sends the information of the progress to the central control portion 150. The central control portion 150, in some cases, outputs the instruction to the movement control portion 149 to change or modify the above described movement schedule. In addition, the work of the parts mounter 1 may be temporarily stopped by the central control portion 150.

In the other embodiment in accordance with the present invention, the parts feeding cassette 31 is mounted on the parts carriage 17 in such a shape that a hole (not shown) provided on its lower surface is fitted to the pin 32 and a hook portion in a lower end of the lever 35 is engaged with the angle member 33 by the force of a spring for urging the lever 35. Meanwhile, the parts feeding cassette 31 is mounted on the parts carriage 17 by a robot for supplying or replacing parts as described later.

Figure 13:
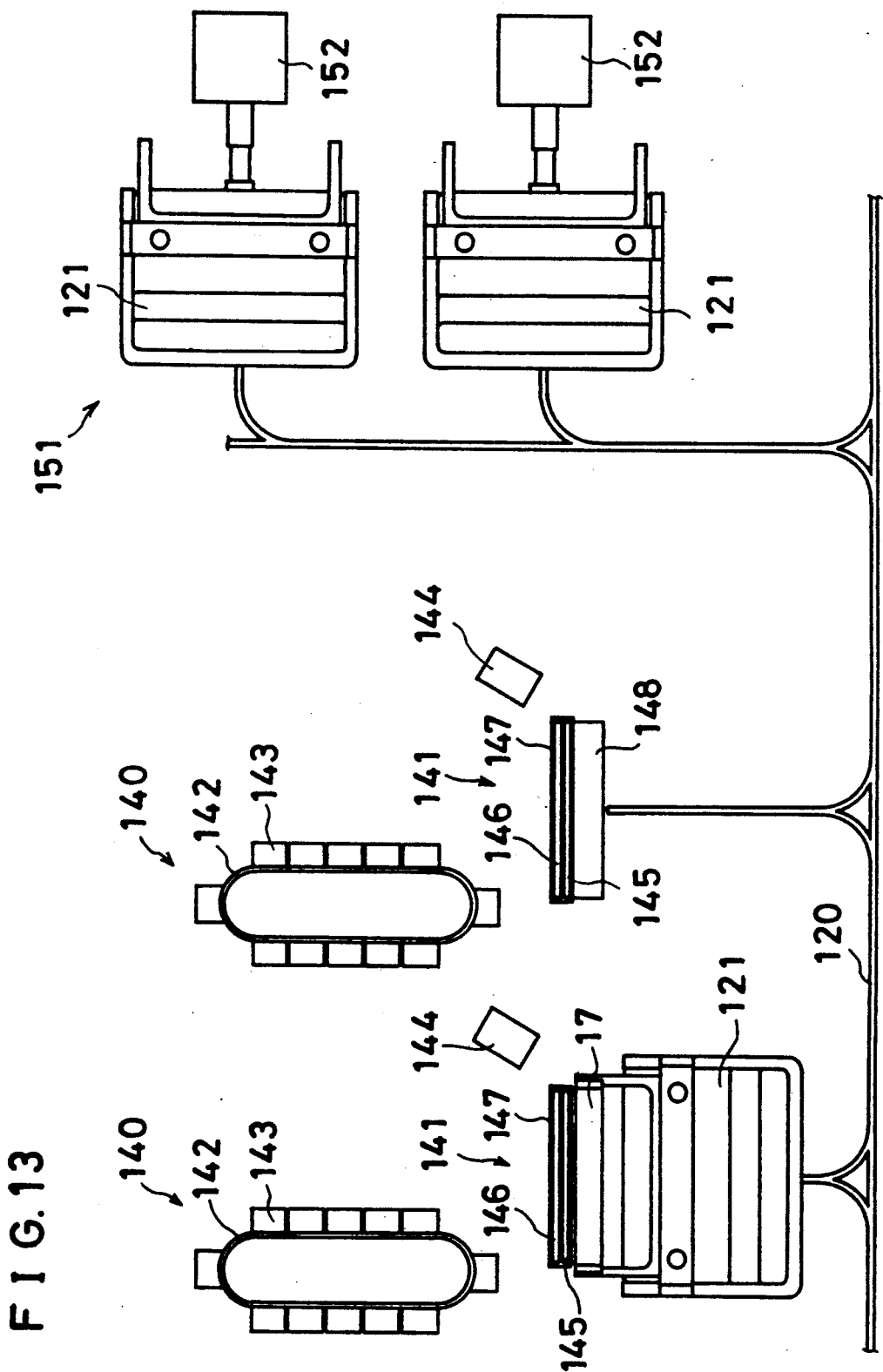
FIG. 13 is a plan view showing the construction of a logistics base.

As shown in FIG. 13, the parts managing portion 123 comprises a stocker 140 arranged inside of the logistics base 122 and a robot 153 for supplying or replacing parts. A stand 145 is located in front of the stocker 140, and the parts carriage 17 taken in by the unmanned conveying machine 121 is disposed thereon, to supply or replace a parts feeding cassette 31.

Figure 21:
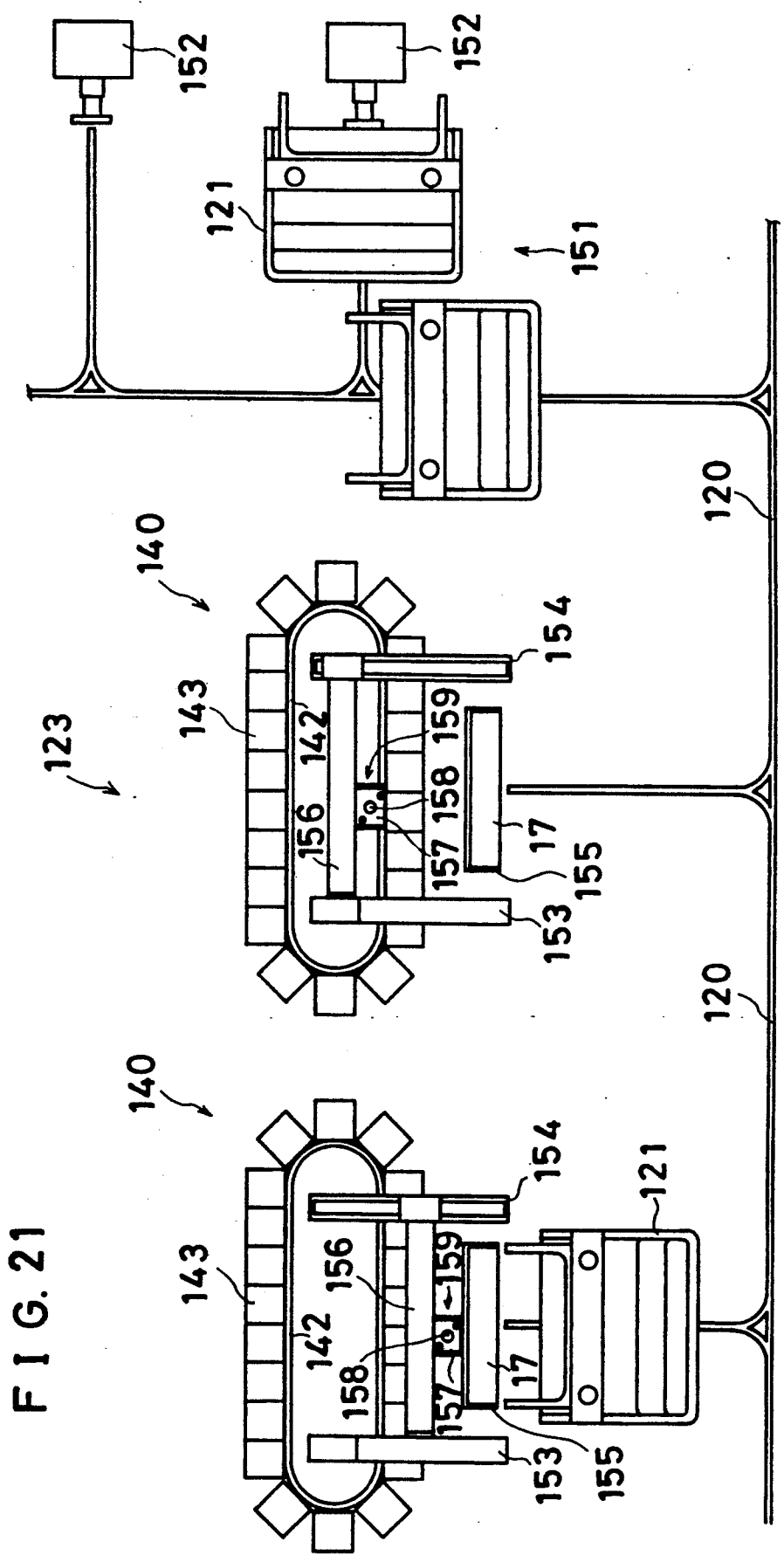
FIG. 21 is a plan view showing the construction of a logistics base in the other embodiment in accordance with the present invention.
Figure 22:
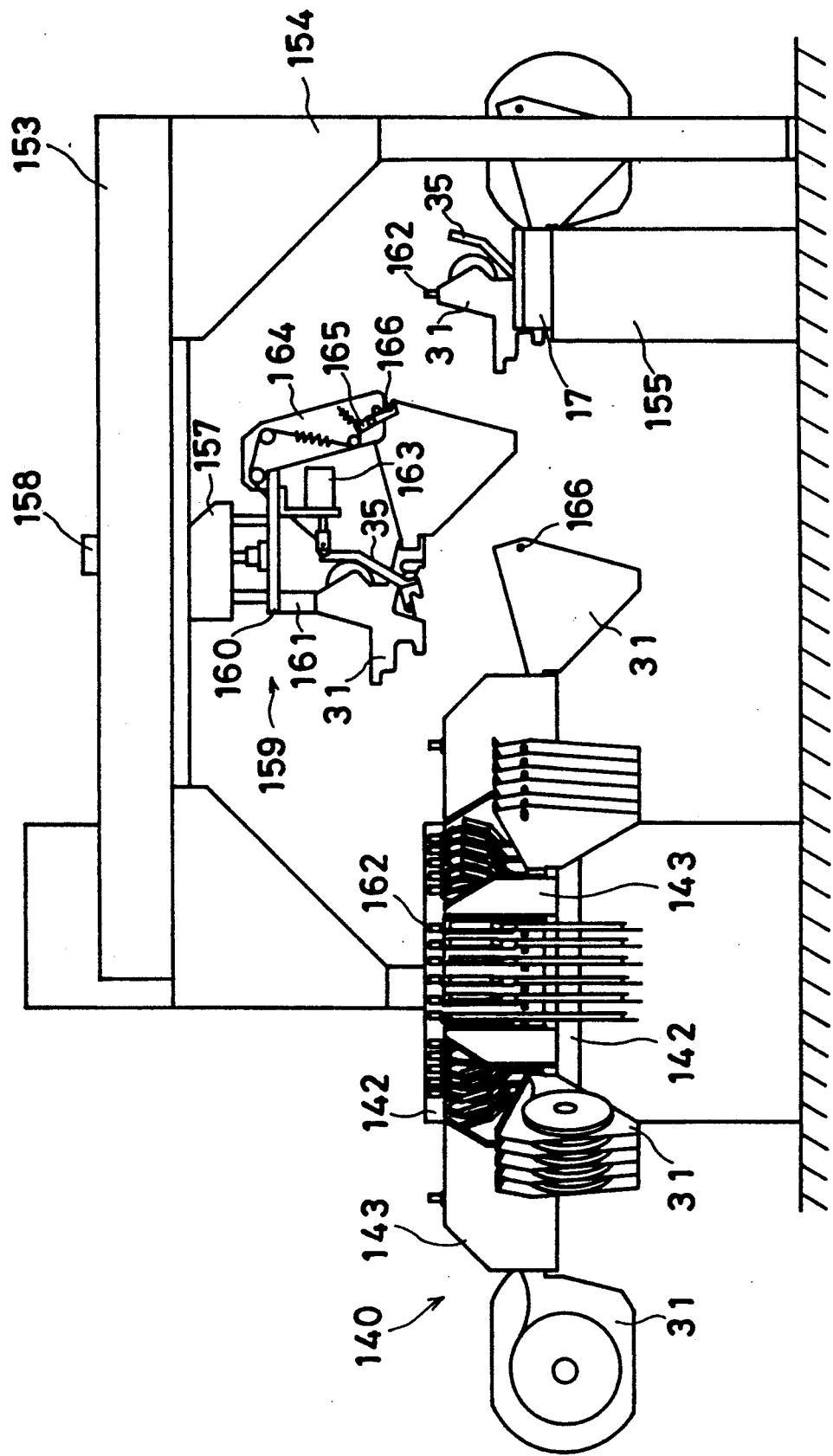
FIG. 22 is a side elevational view showing the schematic structure of a robot for supplying or replacing parts.

The stocker 140 is used for storing all types of parts used in the parts mounter 1 and a required number of parts feeding cassettes 31. In FIGS. 21 and 22, the stocker 140 is so adapted that a plurality of racks 143 are supported on a pair of endless rails 142 on upper and lower sides and the racks 143 are moved along the endless rails 142 by automatic control. The racks 143 respectively support several parts feeding cassettes 31 having different types of parts. A supporting portion for supporting a parts feeding cassettes 31 of the rack 143 is provided with a plurality of pins and angle members, similarly to the parts carriage 17, which supports the parts feeding cassettes 31 in the same manner as that of the parts carriage 17.

The robot 153 for supplying or replacing parts is of a rectangular coordinate type, which takes out a parts feeding cassette 31 requiring supply or exchange of parts from the parts carriage 17 taken in by the unmanned conveying machine 121 to mount the same on a predetermined rack 143 in the stocker 140, and takes out a parts feeding cassette 31 equipped with parts required by the parts carriage 17 from the rack 143 to mount the same on the parts carriage 17. Reference numeral 154 denotes a pair of portal bridges, its one leg being located inside of the stocker 140 and the other leg being located in the vicinity of a stand 155.

The robot 153 for supplying or replacing parts respectively obtains the movement in the direction of the y-axis by a moving beam 156 which is located on the upper surface of the bridge 154, the movement in the direction of the x-axis by a slider 157 which moves along the moving beam 156, and the movement in the direction of the z-axis by an air cylinder 158 which is attached to the slider 157.

Reference numeral 159 denotes a cassette holding head in the robot 153 for supplying or replacing parts. The parts feeding cassette 31 is held by the cassette holding head 159 in the following manner. When the cassette holding head 159 arrives directly over a desired parts feeding cassette 31 in the parts carriage 17 which is place on the stand 155, it drives the air cylinder 148 to lower a base 160. Consequently, a socket 161 covers a knob 162 of the parts feeding cassette 31. Then, a pusher cylinder 163 pushes an upper part of the lever 35 of the parts feeding cassette 31, to rotate the lever 35 in the counterclockwise direction in FIG. 22. Thus, the engagement of the hook portion of the lever 35 with the angle member 33 on the parts carriage 17 is released, and the parts feeding cassette 31 can be lifted up by friction produced by resilience of the lever 35 between the knob 162 and the socket 161 or between the lever 35 and the pusher cylinder 163. A latch 165 attached to a bracket 164 projected from the base 160 is rotated in the counterclockwise direction in FIG. 22 in synchronization with a pushing operation of the pusher cylinder 163 and is engaged with a pin 166 (see FIG. 2) projected from a tail of the parts feeding cassette 31.

The latch 165 is usually urged by a spring to a position where it is not engaged with the pin 166. If a pushing portion of the pusher cylinder 163 advances, however, the latch 165 is pulled by a wire connected thereto to be rotated in the counterclockwise direction. Then, if the base 160 is raised, the parts feeding cassette 31 comes off the pin 32 on the parts carriage 17, to complete holding of the parts feeding cassette 31. Thereafter, the parts feeding cassette 31 is conveyed to a desired rack 143 by the movement of the moving beam 156 and the slider 157, the base 160 is lowered, and a rod of the pusher cylinder 163 is pulled into it to attach the parts feeding cassette 31 to the rack 143. The parts feeding cassette 31 is to the rack 143. The parts feeding cassette 31 is moved from the rack 143 to the parts carriage 17 in the reverse order.

Figure 23:
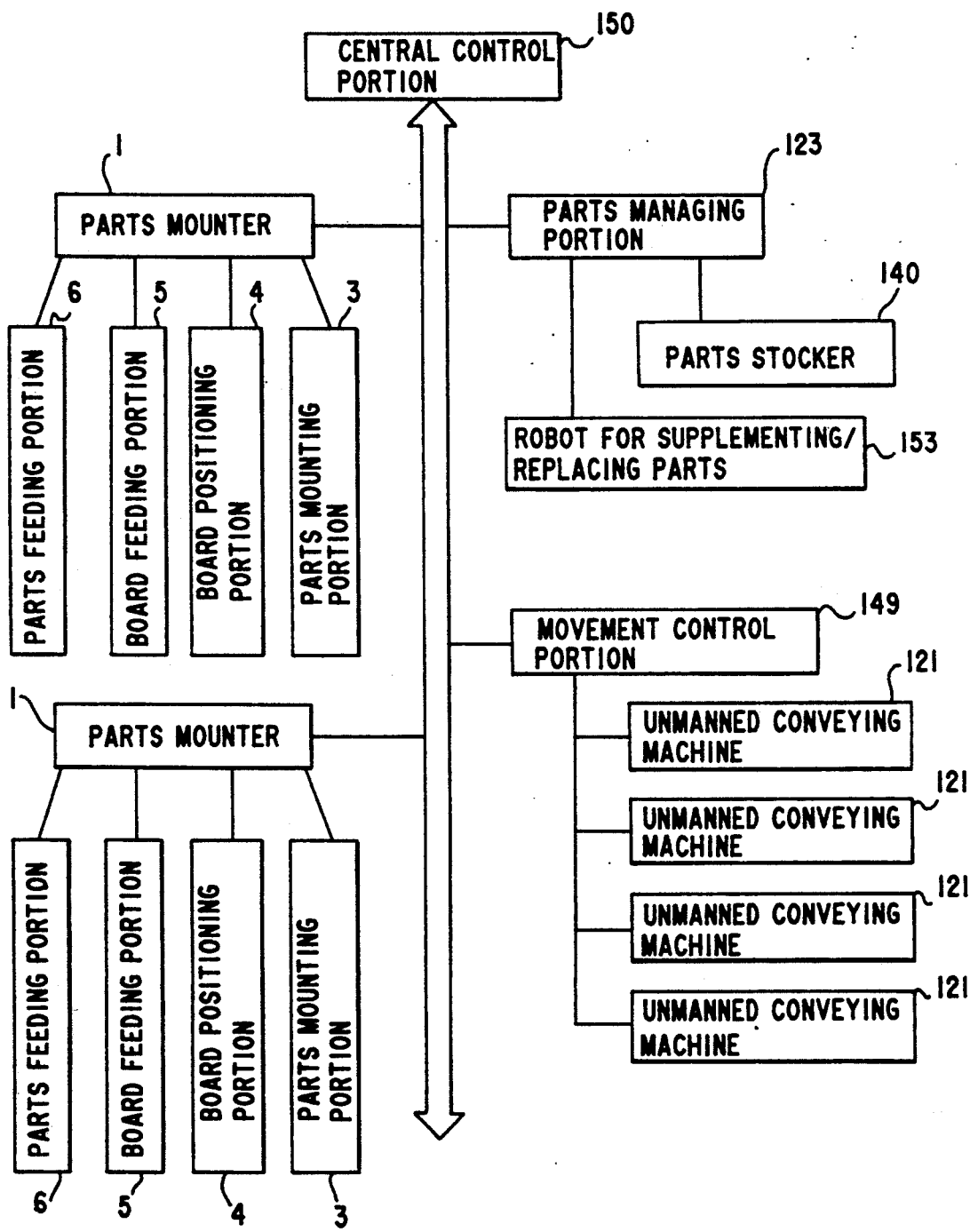
FIG. 23 is a block diagram showing the parts feeding system of the other embodiment.

The contents of the work of the parts managing portion 123 will be described. The unmanned conveying machine 121 which takes the parts carriage 17 in the base 122 for arrival and departure disposes the parts carriage 17 on the stand 156 and moves apart from this place so as to perform the next work by a command of the movement control portion 149 shown in FIG. 23. Thereafter, the robot 153 for supplying or replacing parts takes out a parts feeding cassette 31 which is a problem and mounts the same on a predetermined rack 143 in the stocker 140 and alternatively, takes out a desired parts feeding cassette 31 from the stocker 140 and mounts the same on the parts carriage 17. The central control portion 150 shown in FIG. 23 gives a command to the parts managing portion 123 so as to move the rack 143 to a position where the cassette holding head 147 can convey the parts feeding cassette 31 by the shortest route in conformity with the contents of the work of the robot 153. The robot 153 transmits a work termination signal to the central control portion 161 when this work is terminated. Consequently, a new command is given to the robot 153 for supplying or replacing parts from the central control portion 150, to move a rack 143 required for the next work to a position convenient for the work. When this work is continued so that the parts carriage 17 is full-equipped with parts, the unmanned conveying machine 121 approaches the parts carriage 17 to take up the parts carriage 17 from the stand 156 and goes to place the same on a parts mounter 1 requiring the parts carriage 17. The destination is not necessarily a parts mounter 1 from which this parts carriage 17 is taken out. With respect to the parts feeding cassette 31 which is short in parts, a worker performs work of supplying parts in one section of the parts stocker 140.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parts feeding system, comprising:
    a plurality of cassette carriages each detachably combined with one of a plurality of parts mounters, each said cassette carriage holding one or more parts feeding cassettes loaded with parts to be used by said plurality of parts mounters;
    an unmanned conveying machine for retrieving said cassette carriages from said plurality of parts mounters or for delivering said cassette carriages to said plurality of parts mounters;
    at least one logistics base for said unmanned conveying machine; and
    parts stocking means arranged in said logistics base for storing at least one parts feeding cassette, wherein
    said unmanned conveying machine returns to said logistics base with at least one cassette carriage retrieved from one of said parts mounters, said unmanned conveying machine departs from said logistics base to deliver at least one cassette carriage to one of said plurality of said parts mounters,
    wherein each said parts mounter is provided with a track for moving said cassette carriages thereon, a portion of said track being assigned as a work station where parts are taken out of said parts feeding cassettes, each end portion of said track being assigned as a carriage change station where each said cassette carriage is retrieved from said track by said unmanned conveying machine or delivered from said unmanned conveying machine to said track, and each of said parts mounters includes two carriage carriers movable on said track, each said cassette carriage being supported on one of said two carriage carriers, wherein one of said carriage carriers moves only between one end portion of said track and said work station and another of said carriage carriers moves only between another end portion of said track and said work station.

2. A parts feeding system in accordance with claim 1, wherein clamp means is provided between said cassette carriage and said carriage carrier, and operating means for operating said clamp means is provided in said carriage change station.

3. A parts feeding system in accordance with claim 1, wherein said unmanned conveying machine includes a lifter for retrieving said cassette carriage from said carriage carrier or delivering said cassette carriage to said carriage carrier.

4. A parts feeding system in accordance with claim 1, wherein said track is capable of holding a plurality of said cassette carriages at the same time, wherein one of said cassette carriages can be retrieved by said unmanned conveying machine while another cassette carriage remains on said track for parts feeding.

5. A parts feeding system in accordance with claim 4, wherein each of said parts mounters includes one or more positioners movable along said track, said positioner being connected to said carriage carrier to move the same and capable of being disconnected from said carriage carrier.

6. A parts feeding system in accordance with claim 5, wherein operating means for connecting said positioner to said carriage carrier or disconnecting said positioner from said carriage carrier is provided in said carriage change station.

7. A parts feeding system in accordance with claim 1, further comprising guide tracks laid on a floor via said logistics bases and said plurality of parts mounters, wherein said unmanned conveying machine moves along said guide tracks.

8. A parts feeding system in accordance with claim 1, further comprising one or more designation units arranged in said logistics base for designating supply or exchange of the parts, wherein said unmanned conveying machine delivers cassette carriages to any one of said designation units and receives cassette carriages from any one of said designation units.

9. A parts feeding system in accordance with claim 8, wherein each of said designation units includes a display console having a supporting portion for supporting said cassette carriages and designation means aligned with said parts feeding cassettes on said cassette carriages being supported by said supporting portion.

10. A parts feeding system in accordance with claim 9, wherein each of said designation units includes a display device which displays commands on work to be performed with respect to parts supply and exchange.

11. A parts feeding system in accordance with claim 1, further comprising one or more robots arranged in said logistics base for automatically supplying or exchanging parts feeding cassettes on said cassette carriages.

12. A parts feeding system in accordance with claim 11, wherein each of said robots includes means for transferring said parts feeding cassettes from a parts stock means to said cassette carriages or vice versa.

13. A parts feeding system according to claim 1 wherein said unmanned conveying machine retrieves or delivers said cassette carriages from one of said carriage change stations where one of said carriage carriers is stopped.

14. A parts feeding system according to claim 1 wherein said portion of said track assigned as said work station is a center portion.

* * * * *